United States Patent
Endo et al.

(10) Patent No.: US 9,640,317 B2
(45) Date of Patent: May 2, 2017

(54) WIRELESS POWER TRANSMITTER AND WIRELESS POWER RECEIVER

(71) Applicant: ADVANTEST CORPORATION, Tokyo (JP)

(72) Inventors: Yuki Endo, Tokyo (JP); Yasuo Furukawa, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 466 days.

(21) Appl. No.: 14/200,888

(22) Filed: Mar. 7, 2014

(65) Prior Publication Data

US 2014/0183972 A1 Jul. 3, 2014

Related U.S. Application Data

(63) Continuation of application No. PCT/JP2012/005451, filed on Aug. 29, 2012.

(30) Foreign Application Priority Data

Sep. 28, 2011 (JP) .................................. 2011-213341

(51) Int. Cl.
*H01F 38/14* (2006.01)
*H02J 5/00* (2016.01)
(Continued)

(52) U.S. Cl.
CPC ............ *H01F 38/14* (2013.01); *B60L 11/182* (2013.01); *H02J 5/005* (2013.01); *H02J 17/00* (2013.01);
(Continued)

(58) Field of Classification Search
CPC .. B60L 5/005; B60L 11/1809; B60L 11/1811; B60L 11/1812; B60L 11/1816;
(Continued)

(56) References Cited

U.S. PATENT DOCUMENTS

| | | | | |
|---|---|---|---|---|
| 5,661,391 | A | * | 8/1997 | Ito ........................ B60L 11/182 320/108 |
| 2009/0268181 | A1 | | 10/2009 | Tezuka et al. |
| 2011/0254379 | A1 | * | 10/2011 | Madawala .............. H02J 5/005 307/104 |
| 2011/0291606 | A1 | * | 12/2011 | Lee ........................ B60L 11/182 320/101 |

(Continued)

FOREIGN PATENT DOCUMENTS

| | | |
|---|---|---|
| CN | 102089837 A | 6/2011 |
| JP | 11-155245 | 6/1999 |

(Continued)

OTHER PUBLICATIONS

A. Karalis, J.D. Joannopoulos, M. Soljacic, "Efficient wireless non-radiative mid-range energy transfer" Annals of Physics vol. 323, Jan. 2009, pp. 34-48.

(Continued)

*Primary Examiner* — Levi Gannon
(74) *Attorney, Agent, or Firm* — Cantor Colburn LLP

(57) ABSTRACT

An automatic tuning assist circuit is coupled with a transmission antenna. The automatic tuning assist circuit injects a correction current into, or otherwise draws the correction current from, the transmission antenna. An H-bridge circuit is arranged between a first terminal and a second terminal coupled with the transmission antenna. The H-bridge circuit is switched on and off with a frequency that is equal to the frequency of a driving voltage. A third auxiliary coil is arranged between the output terminals of the H-bridge circuit.

28 Claims, 22 Drawing Sheets

(51) Int. Cl.
*H04B 5/00* (2006.01)
*H02J 50/12* (2016.01)
*H02J 17/00* (2006.01)
*B60L 11/18* (2006.01)
*H03H 11/30* (2006.01)
*H02J 7/02* (2016.01)

(52) U.S. Cl.
CPC ............. *H02J 50/12* (2016.02); *H03H 11/30* (2013.01); *H04B 5/0037* (2013.01); *H04B 5/0075* (2013.01); *B60L 2210/20* (2013.01); *H02J 7/025* (2013.01); *Y02T 10/7005* (2013.01); *Y02T 10/7072* (2013.01); *Y02T 10/725* (2013.01); *Y02T 90/122* (2013.01); *Y02T 90/127* (2013.01); *Y02T 90/14* (2013.01)

(58) Field of Classification Search
CPC  B60L 11/182; B60L 11/1829; B60L 11/1831; H01F 38/14; H02J 5/00; H02J 5/005; H02J 7/025; H02J 17/00; H02J 50/00; H02J 50/10; H02J 50/12; H04B 5/0037; H04B 5/0075; H04B 5/0081; H04B 5/0087; H04B 5/0093; Y02T 10/7005; Y02T 10/7072; Y02T 10/725; Y02T 90/10; Y02T 90/122
USPC ......................................................... 307/104
See application file for complete search history.

(56) References Cited

U.S. PATENT DOCUMENTS

2013/0069424 A1\* 3/2013 Kajouke ............. B60L 11/1812
307/9.1

FOREIGN PATENT DOCUMENTS

| JP | 2009-201211 | 9/2009 |
| JP | 2009-268181 | 11/2009 |
| JP | 2011-517265 | 5/2011 |
| WO | 2009/122355 | 10/2009 |
| WO | 2010/005324 | 1/2010 |

OTHER PUBLICATIONS

International Search Report for the corresponding PCT Application No. PCT/JP2012/005451 mailed on Nov. 27, 2012 with English translation.
International Preliminary Examination Report on Patentability (I) with Written Opinion of ISA for the corresponding PCT Application No. PCT/JP2012/005451 issued on Apr. 1, 2014 with an English translation.
Office Action corresponding to Taiwanese Patent Application No. 101132876; Date of Mailing: Nov. 19, 2015, with English translation.
Office action dated Nov. 18, 2014 from corresponding Japanese Patent Application No. 2011-213341 and its English translation from the applicants.

\* cited by examiner

30b

WIRELESS POWER TRANSMITTER AND WIRELESS POWER RECEIVER

CROSS-REFERENCE TO RELATED APPLICATIONS

This application is a continuation of International Patent Application No. PCT/JP2012/005451 filed on Aug. 29, 2012 which claims priority to Japanese Patent Application No. 2011-213341 filed on Sep. 28, 2011, the disclosures of which are hereby incorporated by reference in their entireties.

BACKGROUND OF THE INVENTION

1. Field of the Invention

The present invention relates to a wireless power supply technique.

2. Description of the Related Art

In recent years, wireless (contactless) power transmission has been receiving attention as a power supply technique for electronic devices such as cellular phone terminals, laptop computers, etc., or for electric vehicles. Wireless power transmission can be classified into three principal methods using an electromagnetic induction, an electromagnetic wave reception, and an electric field/magnetic field resonance.

The electromagnetic induction method is employed to supply electric power at a short range (several cm or less), which enables electric power of several hundred watts to be transmitted in a band that is equal to or lower than several hundred kHz. The power use efficiency thereof is on the order of 60% to 98%.

In a case in which electric power is to be supplied over a relatively long range of several meters or more, the electromagnetic wave reception method is employed. The electromagnetic wave reception method allows electric power of several watts or less to be transmitted in a band between medium waves and microwaves. However, the power use efficiency thereof is small. The electric field/magnetic field resonance method has been receiving attention as a method for supplying electric power with relatively high efficiency at a middle range on the order of several meters. Related techniques are disclosed in Non-patent document (A. Karalis, J. D. Joannopoulos, M. Soljacic, "Efficient wireless non-radiative mid-range energy transfer" ANNALS of PHYSICS Vol. 323, January 2008, pp. 34-48), for example.

FIG. 1 is a diagram showing a wireless power transmission system according to a comparison technique. The wireless power transmission system $1r$ includes a wireless power supply transmitter $2r$ and a wireless power receiver $4r$. The wireless power supply transmitter $2r$ includes a transmission coil $L_{TX}$, a resonance capacitor $C_{TX}$, and an AC power supply $10r$. The wireless power receiver $4r$ includes a reception coil $L_{RX}$, a resonance capacitor $C_{RX}$, and a load $70$.

The resonance frequency is an important factor in magnetic field (electric field) resonance power transmission. The resonance frequency of the transmitter side LC resonance circuit is represented by $f_{TX}=1/(2\pi\sqrt{(L_{TX}\cdot C_{TX})})$. The resonance frequency of the receiver side LC resonance circuit is represented by $f_{RX}=1/(2\pi\sqrt{(L_{RX}\cdot C_{RX})})$. Thus, in order to provide high-efficiency electric power transmission, there is a need to appropriately adjust the transmitter-side and receiver-side resonance frequencies and the frequency of the AC power supply $10r$. However, in actuality, such resonance frequencies fluctuate depending on various kinds of factors.

It is difficult for the power receiver side to tune the fluctuating resonance frequency based on the magnetic field (or electric field) itself as it has been transmitted from the power supply transmitter. This is because, in some cases, the resonance frequency detected by the power receiver side further changes depending on the resonance frequency and the phase conditions of the power receiver side.

SUMMARY OF THE INVENTION

The present invention has been made in order to solve such a problem. Accordingly, it is an exemplary purpose of an embodiment of the present invention to provide a wireless power supply transmitter, a wireless power receiver, and a wireless power supply system, which are capable of automatically tuning the resonance frequency.

An embodiment of the present invention relates to a wireless power supply transmitter configured to transmit an electric power signal comprising any one from among an electric field, a magnetic field, and an electromagnetic field to a wireless power receiver. The wireless power supply transmitter comprises: a transmission antenna comprising a transmission coil; a power supply configured to apply an AC driving voltage between both ends of the transmission antenna; and an automatic tuning assist circuit coupled with the transmission antenna, and configured to inject a first correction current into, or otherwise to draw a first correction current from, the transmission antenna. The automatic tuning assist circuit comprises a first auxiliary coil. The automatic tuning assist circuit is configured to alternately switch between (1) a state in which the first auxiliary coil is coupled with the transmission antenna, and the first correction current that corresponds to a current that flows through the first auxiliary coil is injected into or otherwise drawn from the transmission antenna, and (2) a state in which the first auxiliary coil is decoupled from the transmission antenna, and the current that flows through the first auxiliary coil flows through a current path which is independent of the transmission antenna.

Also, the state may be switched between the first state and the second state with the same frequency as that of the driving voltage, or otherwise with a frequency obtained by multiplying or otherwise by dividing the frequency of the driving voltage by an odd number.

In a case in which the resonance frequency of the transmission antenna matches the frequency of the driving voltage, the current that flows through the first auxiliary coil becomes zero. In this state, the first correction current also becomes zero.

In a case in which the resonance frequency of the transmission antenna does not match the frequency of the driving voltage, the impedance of the resonance circuit including the transmission antenna functions as a capacitor or otherwise as an inductor. Thus, a current flows through the transmission antenna with a phase delayed or otherwise advanced with respect to the driving voltage. In this case, by switching the state between the first state and the second state, a current is generated so as to flow through the first auxiliary coil. The magnitude (and direction) of the current is (are) adjusted so as to provide phase matching between the current that flows through the transmission antenna and the driving voltage. By means of the first correction current generated as a result of this operation, such an arrangement corrects the difference between the current that is to flow through the transmission antenna in the resonant state and the current that flows through the transmission antenna in a case in which such an automatic tuning assist circuit is not used. Thus, such an arrangement provides a quasi-resonant state.

Such an embodiment provides automatic tuning of the transmission antenna with respect to the driving voltage without adjusting the capacitance of the resonance capacitor or the like.

Another embodiment of the present invention also relates to a wireless power supply transmitter. The wireless power supply transmitter comprises: a transmission antenna comprising a transmission coil; a power supply configured to apply an AC driving voltage between both ends of the transmission antenna; and an automatic tuning assist circuit coupled with the transmission antenna, and configured to inject a correction current into, or otherwise draw the correction current from, the transmission antenna. The automatic tuning assist circuit comprises: a first terminal and a second terminal coupled with the transmission antenna; an H-bridge circuit arranged between the first terminal and the second terminal; and a third auxiliary coil arranged between output terminals of the H-bridge circuit.

The H-bridge circuit may be switched on and off with the same frequency as that of the driving voltage, or with a frequency obtained by multiplying or otherwise dividing the frequency of the driving voltage by an odd number.

With such an embodiment, during a half period from a predetermined phase of the driving voltage, of the four switches of the H-bridge circuit, a first pair of oppositely positioned switches are turned on. Furthermore, during the following half period, a second pair of switches are turned on. In the half period in which the first pair of switches are turned on, the current that flows through the third auxiliary coil is supplied to the transmission antenna in a first direction. On the other hand, in the half period in which the second pair of switches are turned on, the current that flows through the third auxiliary coil is supplied to the transmission antenna in a second direction.

In a case in which the resonance frequency of the transmission antenna matches the frequency of the driving voltage, the current that flows through the third auxiliary coil becomes zero.

In a case in which the resonance frequency of the transmission antenna does not match the frequency of the driving voltage, the impedance of the resonance circuit including the transmission antenna functions as a capacitor or otherwise as an inductor. Thus, a current flows through the transmission antenna with a phase delayed or otherwise advanced with respect to the driving voltage. In this case, by switching the H-bridge circuit, a current is generated so as to flow through the third auxiliary coil. The magnitude (and direction) of the current is (are) adjusted so as to provide phase matching between the current that flows through the transmission antenna and the driving current. By means of the third correction current generated as a result of this operation, such an arrangement corrects the difference between the current that is to flow through the transmission antenna in the resonant state and the current that flows through the transmission antenna in a case in which such an automatic tuning assist circuit is not used. Thus, such an arrangement provides a quasi-resonant state.

Such an embodiment provides automatic tuning of the transmission antenna with respect to the driving voltage without adjusting the capacitance of the resonance capacitor or the like.

Yet another embodiment of the present invention relates to a wireless power receiver configured to receive an electric power signal comprising any one from among an electric field, a magnetic field, and an electromagnetic field, transmitted from a wireless power supply transmitter. The wireless power receiver comprises: a reception antenna comprising a reception coil; and an automatic tuning assist circuit coupled with the reception antenna, and configured to inject a first correction current into, or otherwise draw a first correction current from, the reception antenna. The automatic tuning assist circuit comprises a first auxiliary coil. The automatic tuning assist circuit is configured to alternately switch between (1) a state in which the first auxiliary coil is coupled with the reception antenna, and the first correction current that corresponds to a current that flows through the first auxiliary coil is injected into or otherwise drawn from the reception antenna and (2) a state in which the first auxiliary coil is decoupled from the reception antenna, and the current that flows through the first auxiliary coil flows through a current path which is independent of the reception antenna.

Also, the state may be switched between the first state and the second state with the same frequency as that of the electric power signal, or otherwise with a frequency obtained by multiplying or otherwise dividing the frequency of the electric power signal by an odd number.

In a case in which the resonance frequency of the reception antenna matches the frequency of the electric power signal, the current that flows through the first auxiliary coil becomes zero. In this state, the first correction current also becomes zero.

In a case in which the resonance frequency of the reception antenna does not match the frequency of the electric power signal, the impedance of the resonance circuit including the reception antenna functions as a capacitor or otherwise as an inductor. Thus, a current flows through the reception antenna with a phase delayed or otherwise advanced with respect to the electric power signal. In this case, by switching the state between the first state and the second state, a current is generated so as to flow through the first auxiliary coil. The magnitude (and direction) of the current is (are) adjusted so as to provide phase matching between the current that flows through the reception antenna and the electric power signal. By means of the first correction current generated as a result of this operation, such an arrangement corrects the difference between the current that is to flow through the reception antenna in the resonant state and the current that flows through the reception antenna in a case in which such an automatic tuning assist circuit is not used. Thus, such an arrangement provides a quasi-resonant state.

Such an embodiment provides automatic tuning of the reception antenna with respect to the electric power signal without adjusting the capacitance of the resonance capacitor or the like.

Yet another embodiment of the present invention also relates to a wireless power receiver. The wireless power receiver comprises: a reception antenna comprising a reception coil; and an automatic tuning assist circuit coupled with the reception antenna, and configured to inject a correction current into, or otherwise draw the correction current from, the reception antenna. The automatic tuning assist circuit comprises: a first terminal and a second terminal coupled with the reception antenna; an H-bridge circuit arranged between the first terminal and the second terminal; and a third auxiliary coil arranged between output terminals of the H-bridge circuit.

The H-bridge circuit may be switched on and off with the same frequency as that of the electric power signal, or with a frequency obtained by multiplying or otherwise dividing the frequency of the electric power signal by an odd number.

With such an embodiment, during a half period from a predetermined phase of the electric power signal, of the four switches of the H-bridge circuit, a first pair of oppositely positioned switches are turned on. Furthermore, during the following half period, a second pair of switches are turned on. In the half period in which the first pair of switches are turned on, the current that flows through the third auxiliary coil is supplied to the reception antenna in a first direction. On the other hand, in the half period in which the second pair of switches are turned on, the current that flows through the third auxiliary coil is supplied to the reception antenna in a second direction.

In a case in which the resonance frequency of the reception antenna matches the frequency of the electric power signal, the current that flows through the third auxiliary coil becomes zero.

In a case in which the resonance frequency of the reception antenna does not match the frequency of the electric power signal, the impedance of the resonance circuit including the reception antenna functions as a capacitor or otherwise as an inductor. Thus, a current flows through the reception antenna with a phase delayed or otherwise advanced with respect to the electric power signal. In this case, by switching the H-bridge circuit, a current is generated so as to flow through the third auxiliary coil. The magnitude (and direction) of the current is (are) adjusted so as to provide phase matching between the current that flows through the reception antenna and the electric power signal. By means of the third correction current generated as a result of this operation, such an arrangement corrects the difference between the current that is to flow through the reception antenna in the resonant state and the current that flows through the reception antenna in a case in which such an automatic tuning assist circuit is not used. Thus, such an arrangement provides a quasi-resonant state.

Such an embodiment provides automatic tuning of the reception antenna with respect to the electric power signal without adjusting the capacitance of the resonance capacitor or the like.

Yet another embodiment of the present invention relates to a wireless power supply system. The wireless power supply system may comprise: the aforementioned wireless power supply transmitter configured to transmit an electric power signal comprising any one from among an electric field, a magnetic field, and an electromagnetic field; and the aforementioned wireless power receiver configured to receive the electric power signal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected/coupled to/with the member B" includes a state in which the member A is indirectly connected/coupled to the member B via another member that does not substantially affect the electric connection therebetween, or that does not damage the functions or effects of the connection therebetween, in addition to a state in which the member A is physically and directly connected/coupled to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Wireless Power Supply Transmitter

First Embodiment

Figure 1:
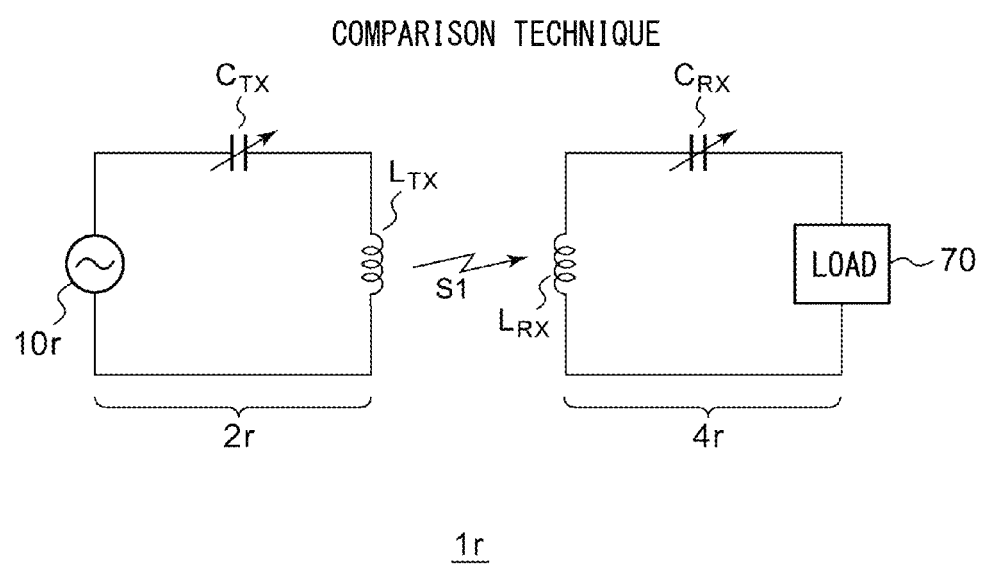
FIG. 1 is a diagram showing a wireless power supply system according to a comparison technique.
Figure 2:
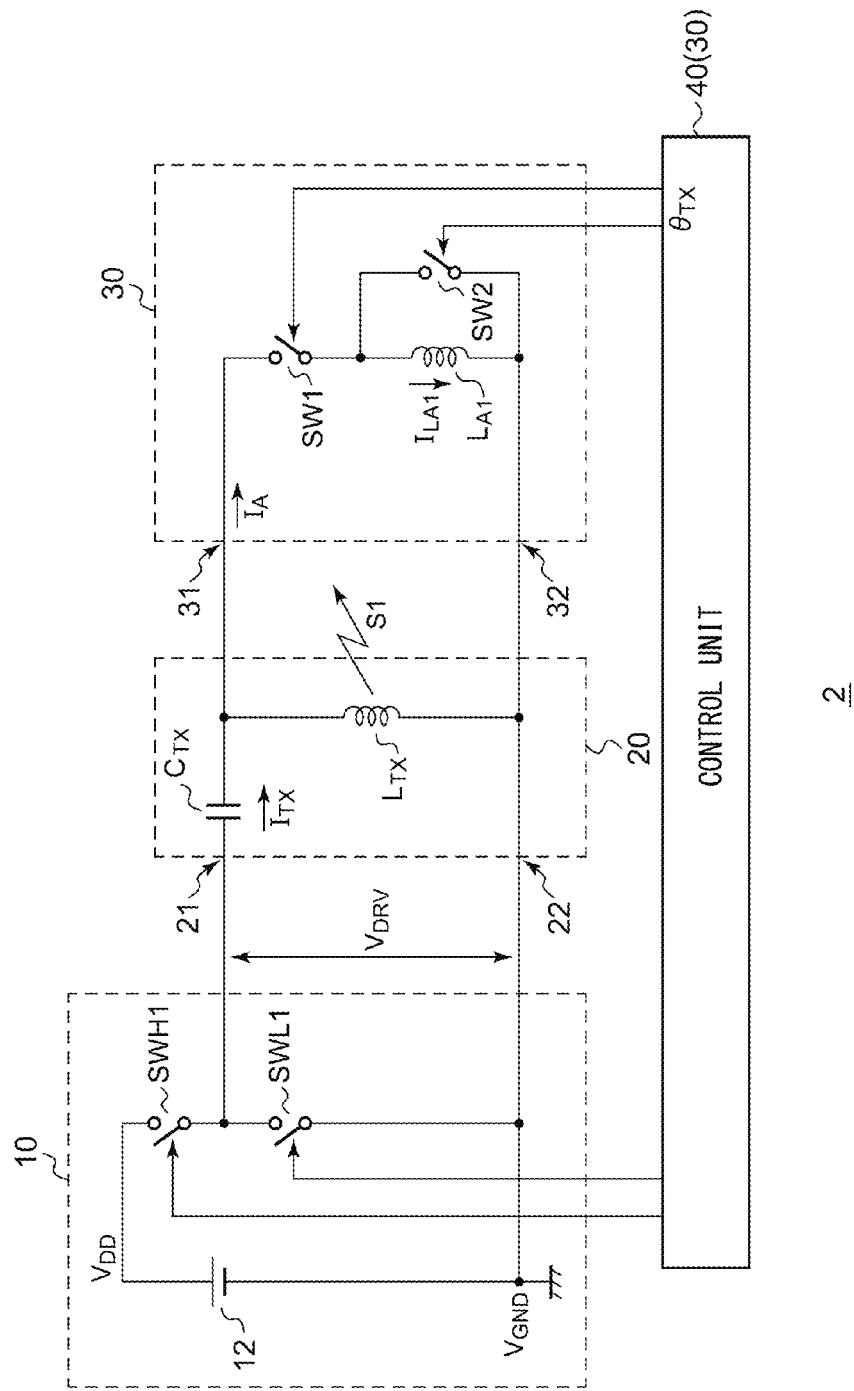
FIG. 2 is a circuit diagram showing a configuration of a wireless power supply transmitter according to a first embodiment.

FIG. 2 is a circuit diagram showing a configuration of a wireless power supply transmitter 2 according to a first embodiment. The wireless power supply transmitter 2 transmits an electric power signal S1 to a wireless power receiver (not shown). As such an electric power signal S1, the wireless power supply transmitter 2 uses the near-field components (electric field, magnetic field, or electromagnetic field) of electromagnetic waves that have not yet become radio waves.

The wireless power supply transmitter 2 includes a power supply 10, a transmission antenna 20, an automatic tuning assist circuit (ATAC) 30, and a control unit 40.

The transmission antenna 20 includes a transmission coil $L_{TX}$ arranged between its first terminal 21 and its second terminal 22. A resonance capacitor $C_{TX}$ is arranged in series with the transmission coil $L_{TX}$. The resonance capacitor $C_{TX}$ and the transmission coil $L_{TX}$ may also be mutually exchanged.

The power supply 10 applies an AC driving voltage $V_{DRV}$ having a predetermined transmission frequency $f_{TX}$ between both ends of the transmission antenna 20. The driving voltage $V_{DRV}$ may have a desired AC waveform, examples of which include a rectangular waveform, a trapezoidal waveform, a sine waveform, and the like. With the present embodiment, the driving voltage $V_{DRV}$ is configured as a rectangular wave signal which swings between a first voltage level (power supply voltage $V_{DD}$) and a second voltage level (ground voltage $V_{GND}$=0 V).

The power supply 10 includes a DC power supply 12, a first high-side switch SWH1, and a first low-side switch SWL1. The DC power supply 12 generates a DC power supply voltage $V_{DD}$. The first high-side switch SWH1 and the first low-side switch SWL1 are sequentially arranged in series between the output terminal of the DC power supply 12 and a fixed voltage terminal (ground terminal). The control unit 40 switches on and off the first high-side switch SWH1 and the first low-side switch SWL1 in a complementary manner, with a transmission frequency $f_{TX}$. The power supply 10 may be configured as an H-bridge circuit.

The automatic tuning assist circuit 30 is directly or indirectly coupled with the transmission antenna 20. The automatic tuning assist circuit 30 injects the first correction current $I_A$ into the relay antenna 20 (in the form of a source current). Otherwise, the automatic tuning assist circuit 30 draws the first correction current $I_A$ from the relay antenna 20 (in the form of a sink current). The automatic tuning assist circuit 30 in FIG. 2 is directly coupled with the transmission antenna 20. Description will be made in the present embodiment with the first correction current $I_A$ that flows in the direction from the transmission antenna 20 to the automatic tuning assist circuit 30 (in the form of a sink current) as the first correction current $I_A$ having a positive value.

The automatic tuning assist circuit 30 includes a first auxiliary coil $L_{A1}$. The automatic tuning assist circuit 30 alternately repeats the first state φ1 and a second state φ2 with the same frequency $f_{TX}$ as that of the driving voltage $V_{DRV}$.

In the first state φ1, the first auxiliary coil $L_{A1}$ is coupled with the transmission antenna 20. In this state, a first correction current $I_A$ that corresponds to the current that flows through the first auxiliary coil $L_{A1}$ is injected into or otherwise drawn from the transmission antenna 20.

In the second state φ2, the first auxiliary coil $L_{A1}$ is decoupled from the transmission antenna 20. In this state, the current $I_{LA1}$ that flows through the first auxiliary coil $L_{A1}$ flows through a current path which is independent of the transmission antenna 20.

Specifically, the automatic tuning assist circuit 30 includes a first terminal 31, a second terminal 32, a first switch SW1, a second switch SW2, and a control unit 40, in addition to the first auxiliary coil $L_{A1}$. The first terminal 31 and the second terminal 32 are coupled with the transmission antenna 20. The first switch SW1 and the first auxiliary coil $L_{A1}$ are arranged in series between the first terminal 31 and the second terminal 32. The second switch SW2 is arranged in parallel with the first auxiliary coil $L_{A1}$.

The control unit 40 switches on and off the first switch SW1 and the second switch SW2 in a complementary manner, with the same frequency $f_{TX}$ as that of the driving voltage $V_{DRV}$, and with a predetermined phase difference $\theta_{TX}$ with respect to the driving voltage $V_{DRV}$. Specifically, in the first state φ1, the control unit 40 turns on the first switch SW1 and turns off the second switch SW2. In the second state φ2, the control unit 40 turns off the first switch SW1 and turns on the second switch SW2. The phase difference $\theta_{TX}$ may preferably be set to a value in the vicinity of +0 degrees or otherwise 180 degrees. That is to say, a part of the control unit 40 functions as a component of the automatic tuning assist circuit 30.

In the first state φ1, the first switch SW1 is turned on, and thus, the first auxiliary coil $L_{A1}$ is coupled with the transmission antenna 20. In the second state φ2, the second switch SW2 is turned on. In this state, the current $I_{LA1}$ that flows through the first auxiliary coil $L_{A1}$ flows through a loop path including the second switch SW2.

The first switch SW1 and the second switch SW2 may each be configured employing a MOSFET (Metal Oxide Semiconductor Field Effect Transistor), IGBT (Insulated Gate Bipolar Transistor), bipolar transistor, or the like. FIGS. 3A through 3F are diagrams each showing an example configuration of a switch employing a MOSFET.

Figure 3A:
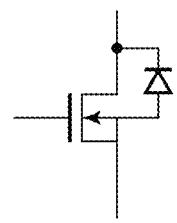
FIGS. 3A through 3F are diagrams each showing an example configuration of a switch employing a MOSFET.
Figure 3B:
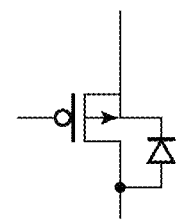
Figure 3C:
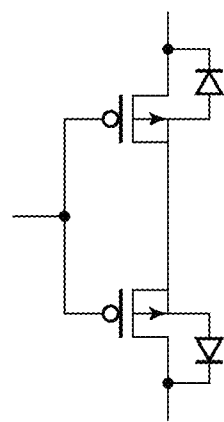
Figure 3D:
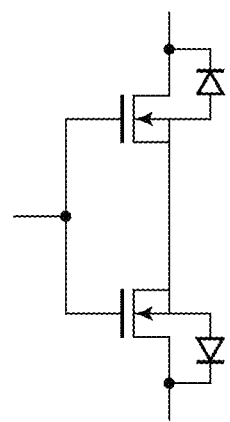
Figure 3E:
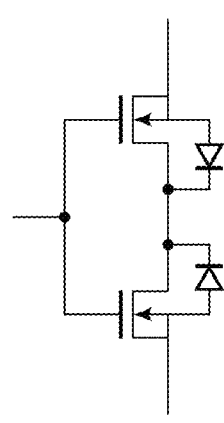
Figure 3F:
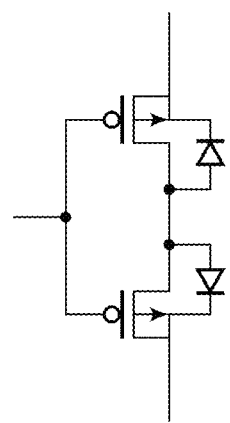

FIG. 3A shows a configuration of the switch employing an N-channel MOSFET. FIG. 3B shows a configuration of the switch employing a P-channel MOSFET. In a case in which the back gate of the MOSFET is connected to its source, the body diode that forms between the back gate and the drain is in the connection state regardless of the gate voltage. Thus, such a switch configured as a single MOSFET is not capable of blocking a current that flows in one particular direction. In the present specification, such a switch will be referred to as a "uni-directional switch".

The switches shown in FIGS. 3C through 3F each comprise two N-channel MOSFETs or otherwise two P-channel MOSFETs connected such that their body diodes are connected in reverse directions (back-to-back connection). With the switches shown in FIGS. 3C through 3F, in the off state, no current flows in either direction. In the present specification, such a switch will be referred to as a "bi-directional switch".

With the present embodiment, the switches SW1 and SW2 may each be configured as a uni-directional switch or otherwise a bi-directional switch. It should be noted that, in a case in which the switches SW1 and SW2 are each configured as a uni-directional switch, the switches SW1 and SW2 each require a rectifier diode arranged in series. Detailed description of such a modification will be made later.

The above is the configuration of the wireless power supply transmitter 2. Next, description will be made regarding the operation thereof.

Let us consider an arrangement in which the switches SW1 and SW2 are each configured as a bi-directional switch which is capable of blocking a current in both directions in the off state.

Figure 4:
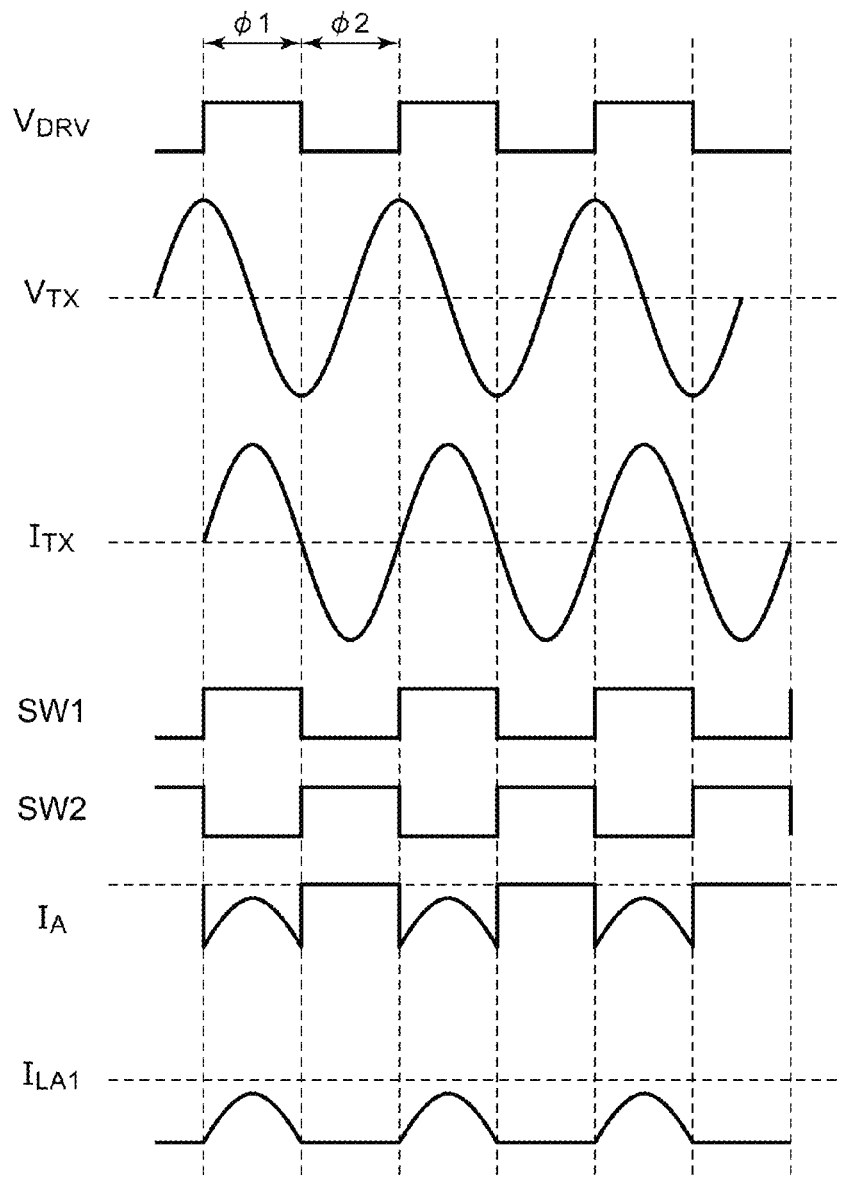
FIG. 4 is a waveform diagram showing the operation of the wireless power supply transmitter shown in FIG. 2.

FIG. 4 shows waveform diagrams each showing the operation of the wireless power supply transmitter 2 shown in FIG. 2. The vertical axis and the horizontal axis shown in the waveform diagrams and the time charts in the present specification are expanded or reduced as appropriate for ease of understanding. Also, each waveform shown in the drawings is simplified for ease of understanding.

FIG. 4 shows, in the following order beginning from the top, the driving voltage $V_{DRV}$, the resonance voltage $V_{TX}$ between the transmission coil $L_{TX}$ side end and the resonance capacitor $C_{TX}$ side end, the resonance current $I_{TX}$ that flows through the transmission antenna 20, the voltage at the first switch SW1, the voltage at the second switch SW2, the first auxiliary current $I_A$, and the current $I_{LA1}$ that flows through the first auxiliary coil $L_{A1}$. In the waveform diagram for each switch, the high level represents the on state, and the low level represents the off state. It should be noted that FIG. 4 shows the waveforms of the resonance current $I_{TX}$ and the resonance voltage $V_{TX}$ obtained after a sufficient time has elapsed after the automatic tuning assist circuit 30 starts to operate.

As shown in FIG. 4, the driving voltage $V_{DRV}$ having a rectangular waveform is applied to the transmission antenna 20. The control unit 40 switches on and off the first switch SW1 and the second switch SW2 in a complementary manner, with the same frequency as that of the driving voltage $V_{DRV}$, and with the same phase $\theta_{TX}$ (=0 degrees) as that of the driving voltage $V_{DRV}$.

By repeatedly switching the state between the first state φ1 and the second state φ2, such an arrangement allows the magnitude and the direction of the current $I_{LA1}$ that flows through the first auxiliary coil $L_{A1}$ to be made to converge to the resonance point such that the phase difference between the driving voltage $V_{DRV}$ and the resonance current $I_{TX}$ becomes zero, i.e., such that the resonant state is obtained.

Figure 5:
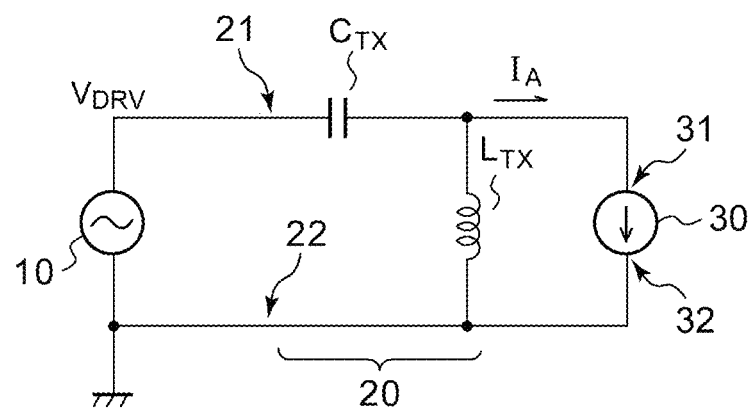
FIG. 5 is an equivalent circuit diagram of the wireless power supply transmitter shown in FIG. 2.

In the second state φ2, the current $I_{LA1}$ flows through a loop including the second switch SW2. In this state, the level of the current $I_{LA1}$ is maintained at a constant value. In the first state φ1, the current $I_{LA1}$ is supplied to the transmission antenna 20 as the first correction current $I_A$. That is to say, the automatic tuning assist circuit 30 can be regarded as a correction current source configured to supply the first correction current $I_A$ to the transmission antenna 20. FIG. 5 is an equivalent circuit diagram of the wireless power supply transmitter 2 shown in FIG. 2.

Figure 6A:
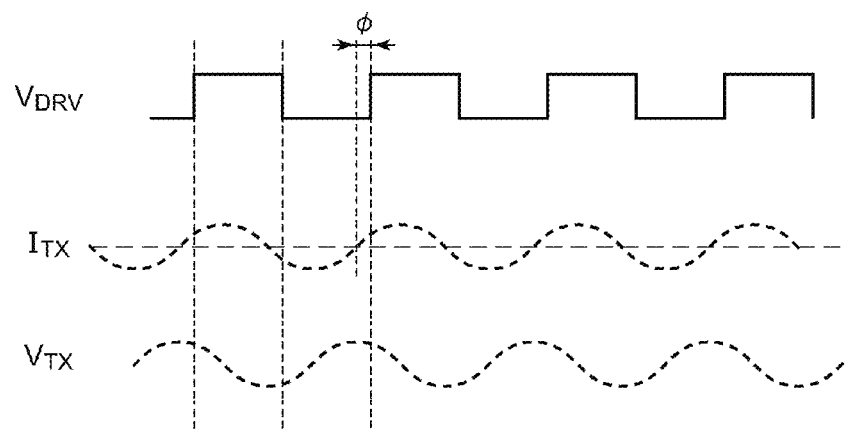
FIG. 6A is a waveform diagram showing a state in which the automatic tuning assist circuit is not operated.
Figure 6B:
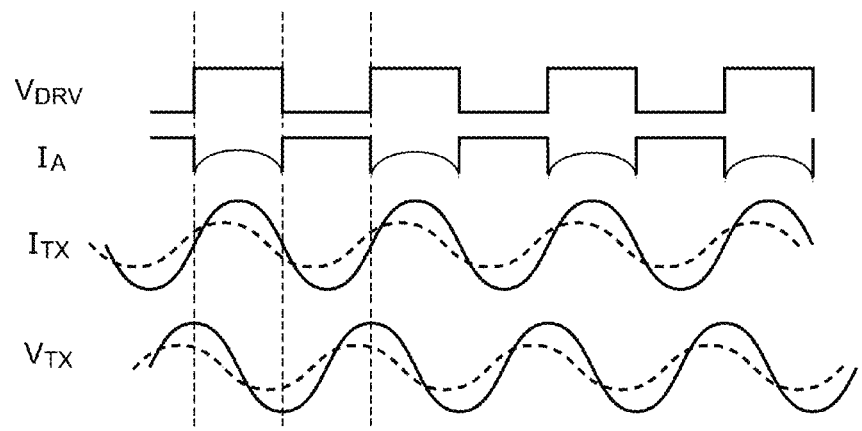
FIG. 6B is a waveform diagram showing a state in which the automatic tuning assist circuit is operated.

FIG. 6A is a waveform diagram showing a state in which the automatic tuning assist circuit 30 does not operate, and FIG. 6B is a waveform diagram showing a state in which the automatic tuning assist circuit 30 operates.

First, description will be made with reference to FIG. 6A regarding the state in which the automatic tuning assist circuit 30 does not operate, i.e., a state in which the first switch SW1 is fixed to the off state, and the second switch SW2 is fixed to the on state. That is to say, a state in which the correction current $I_A$ is zero is shown.

The impedance Z of the transmission antenna 20 is represented by the following Expression (1). The resonance frequency $f_c$ of the transmission antenna 20 is represented by the following Expression (2). The following Expressions (1) and (2) represent the impedance and the resonance frequency assuming that the resistance component is negligible. However, it is needless to say that, in actual circuits, the resistance component connected in series contributes to the circuit impedance.

$$Z = j\omega L_{TX} + 1/(j\omega C_{TX}) \qquad (1)$$

$$f_c = 1/2\pi\sqrt{(L_{TX} \cdot C_{TX})} \qquad (2)$$

In a case in which the frequency $f_{TX}$ of the driving voltage $V_{DRV}$ is higher than the resonance frequency $f_c$ ($f_{TX} > f_c$), the transmission antenna 20 functions as an inductor. In this case, the resonance current $I_{TX}$ that flows through the transmission antenna 20 has a phase which is delayed with respect to the phase of the driving voltage $V_{DRV}$. Conversely, in a case in which the frequency $f_{TX}$ of the driving voltage $V_{DRV}$ is lower than the resonance frequency $f_c$ ($f_{TX} < f_c$), the transmission antenna 20 functions as a capacitor. In this case, the resonance current $I_{TX}$ has a phase which is advanced with respect to the driving voltage $V_{DRV}$.

FIG. 6A shows a state in which $f_c > f_{TX}$. In this state, the resonance current $I_{TX}$ has a phase which is advanced by the phase difference φ with respect to the driving voltage $V_{DRV}$. It should be noted that the phase difference φ is not 90 degrees. This is because the resonance circuit includes a non-negligible resistance component (not shown) connected in series. In the non-resonant state, the impedance Z exhibits a high value, leading to a reduced amplitude of the resonance current $I_{TX}$. In this state, such an arrangement is not capable of transmitting a large amount of electric power.

Next, description will be made with reference to FIG. 6B regarding a case in which the automatic tuning assist circuit 30 operates.

In a case in which the automatic tuning assist circuit 30 operates, the correction current $I_A$ is supplied to the transmission antenna 20 with a phase difference with respect to the driving voltage $V_{DRV}$. As a result, phase matching is obtained between the resonance current $I_{TX}$ and the driving voltage $V_{DRV}$, thereby providing a quasi-resonant state. In this state, the resonance current $I_{TX}$ has a greater amplitude than that in the non-resonant state.

Figure 7:
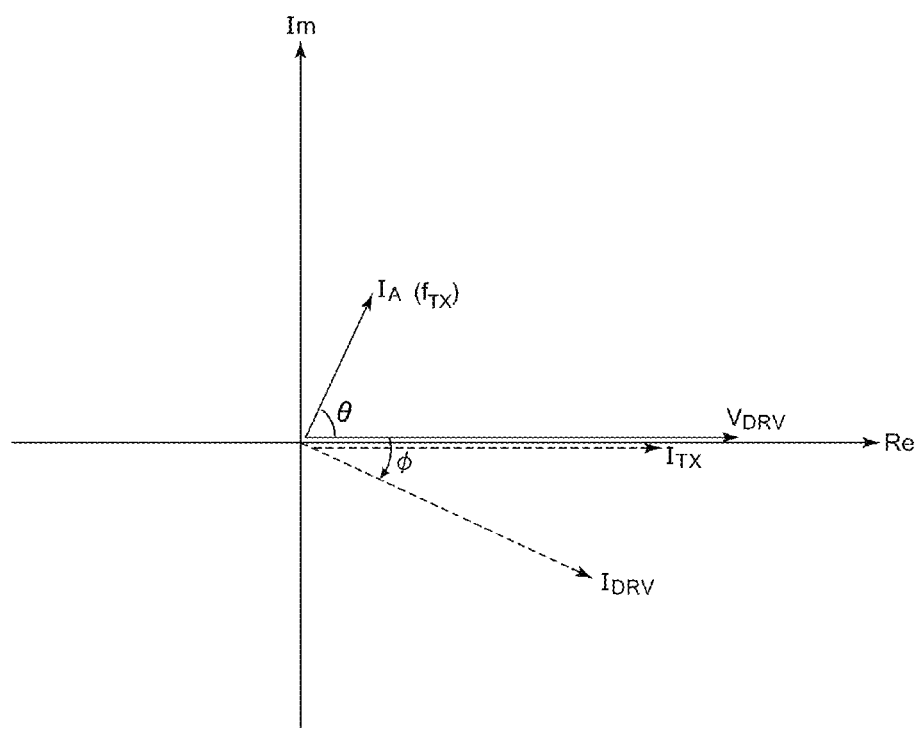
FIG. 7 is a phasor diagram (vector diagram) for describing the quasi-resonant state provided by the automatic tuning assist circuit in a case in which $f_c<f_{TX}$.

FIG. 7 is a phasor diagram (vector diagram) for describing the quasi-resonant state provided by the automatic tuning assist circuit 30.

The correction current $I_A(f_{TX})$ represents the fundamental wave component (having the frequency $f_{TX}$) of the correction current $I_A$ shown in FIG. 4. The correction current $I_A(f_{TX})$ has a phase difference θ with respect to the driving voltage $V_{DRV}$.

Based on the "principle of superposition", the resonance current $I_{TX}$ is configured as the sum of the current component $I_{DRV}$ induced by the driving voltage $V_{DRV}$ and the correction current $I_A(f_{TX})$. By optimizing the amplitude of the correction current $I_A$, such an arrangement is capable of providing phase matching between the driving voltage $V_{DRV}$ (having a phase of 0 degrees) and a resultant current obtained by combining the two current components $I_{DRV}$ and $I_A(f_{TX})$, i.e., the resonance current $I_{TX}$. That is to say, it can be clearly understood that such an arrangement provides a quasi-resonant state.

The above is the principle and the operation of the wireless power supply transmitter 2.

As described above, without adjusting the resonance frequency $f_c$ of the transmission antenna 20, the wireless power supply transmitter 2 is capable of automatically tuning the circuit state so as to provide the quasi-resonant state. In the wireless power transmission, the resonance frequency changes over time according to the position relation between the wireless power supply transmitter 2 and the wireless power receiver 4. The wireless power supply transmitter 2 is capable of following the change in the resonance frequency with high speed, thereby providing high-efficiency electric power transmission.

Furthermore, in a case in which a large amount of electric power is transmitted by means of wireless power transmission, a very high voltage develops between both ends of the resonance capacitor $C_{TX}$, which limits the use of a variable capacitor. With the wireless power supply transmitter 2, there is no need to adjust the capacitance of the resonance capacitor $C_{TX}$. Thus, such an arrangement does not require such a variable capacitor or the like, which is another advantage.

Description has been made above regarding a case in which the first switch SW1 is switched on and off with a phase difference $\theta_{TX}=0$ degrees with respect to the phase of the switching of the first high-side switch SWH1 (driving voltage $V_{DRV}$). However, the phase difference $\theta_{TX}$ between the first switch SW1 and the first high-side switch SWH1 is not restricted to 0 degrees. Also, an arrangement may be made in which the phase difference $\theta_{TX}$ between the first switch SW1 and the first high-side switch SWH1 is set to 180 degrees. In this case, the direction in which the current $I_A$ flows is automatically adjusted such that it is reversed.

That is to say, in a case in which $f_c < f_{TX}$, by setting the phase difference $\theta_{TX}$ to 0 degrees or otherwise 180 degrees, such an arrangement provides a quasi-resonant state.

Also, the phase difference $\theta_{TX}$ may be moved away from 0 degrees or 180 degrees. In this case, in the vector diagram shown in FIG. 7, the phase difference $\theta_{TX}$ between the current components $I_{DRV}$ and $I_A$ does not match 90 degrees. However, even in such a case, the correction current $I_A$ is automatically adjusted such that the resultant resonance current $I_{TX}$ obtained by combining the current components $I_{DRV}$ and $I_A$ has a phase of 0 degrees. It should be noted that, as the phase difference $\theta_{TX}$ becomes closer to 0 degrees or otherwise 180 degrees, the required value of the amplitude of the correction current $I_A$ becomes smaller. This is an advantage in employing an arrangement in which the phase difference $\theta_{TX}$ is set to a value in the vicinity of 0 degrees or otherwise 180 degrees.

The wireless power supply transmitter 2 is capable of automatically providing a quasi-resonant state not only in a case in which $f_c < f_{TX}$, but also in a case in which $f_c > f_{TX}$. In this case, the phase difference $\theta_{TX}$ is preferably set to 180 degrees.

Figure 8:
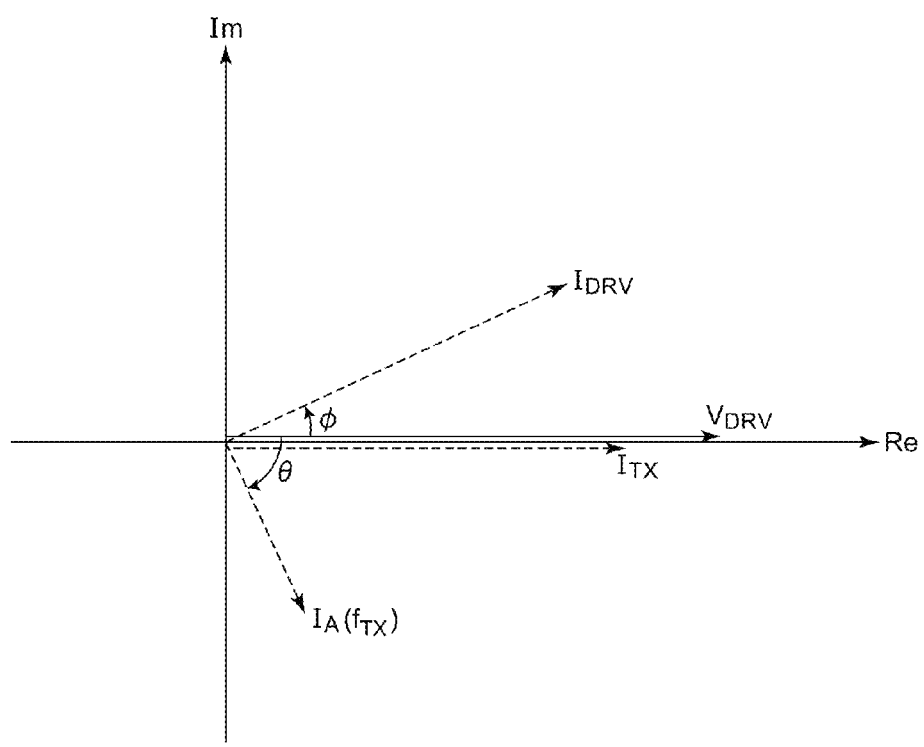
FIG. 8 is a phasor diagram for describing the quasi-resonant state provided by the automatic tuning assist circuit in a case in which $f_c>f_{TX}$.

FIG. 8 is a phasor diagram for describing a quasi-resonant state provided by the automatic tuning assist circuit 30 in a case in which $f_c > f_{TX}$. Description will be made below assuming that the driving voltage $V_{DRV}$ has a phase of 0 degrees, and the correction current $I_A$ has a phase θ. In a case in which $f_c > f_{TX}$, the current has a phase which is advanced with respect to that of the voltage. Such an arrangement also provides a quasi-resonant state even in such a case.

It should be noted that, in a case in which $f_c > f_{TX}$, the phase difference $\theta_{TX}$ may be set to a value in the vicinity of 0 degrees. In this case, the direction in which the correction current $I_A$ flows is automatically reversed so as to provide a quasi-resonant state.

Next, description will be made regarding modifications of the wireless power supply transmitter 2. Each modification may be combined with any one of the other modifications, which is encompassed within the scope of the present invention.

First Modification

Figure 9:
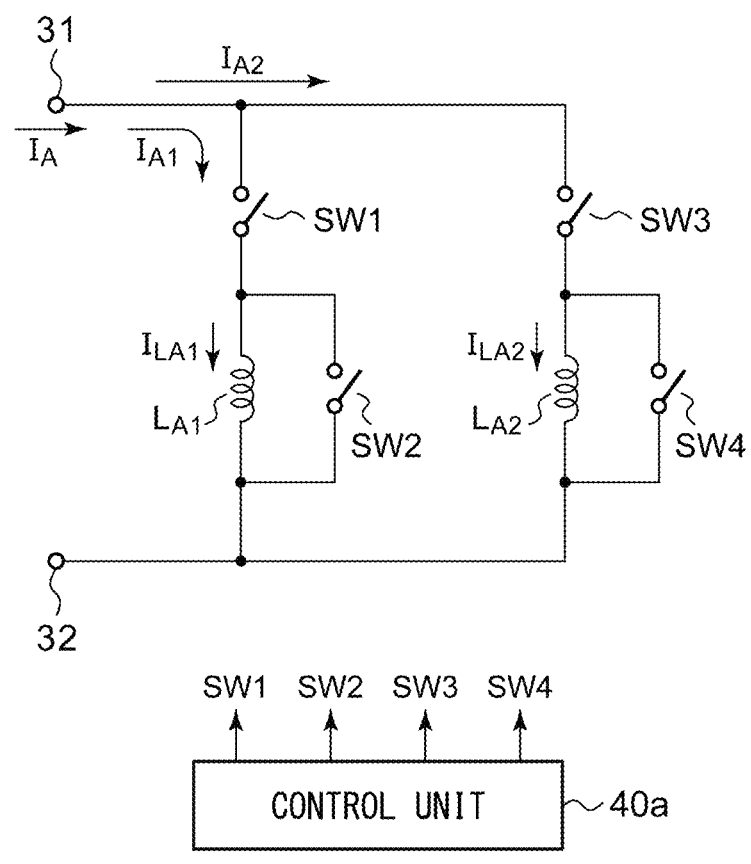
FIG. 9 is a circuit diagram showing a configuration of an automatic tuning assist circuit according to a first modification.

FIG. 9 is a circuit diagram showing a configuration of an automatic tuning assist circuit 30a according to a first modification. The automatic tuning assist circuit 30a includes a second auxiliary coil $L_{A2}$ in addition to the configuration of the automatic tuning assist circuit 30 shown in FIG. 2.

In the first state φ1, the second auxiliary coil $L_{A2}$ is decoupled from the transmission antenna 20. In this state, the current $I_{LA2}$ that flows through the second auxiliary coil $L_{A2}$ flows through a current path that is independent of the transmission antenna 20. In the second state φ2, the second auxiliary coil $L_{A2}$ is coupled with the transmission antenna 20. In this state, the second correction current $I_{A2}$ that corresponds to the current $I_{LA2}$ that flows through the second auxiliary coil $L_{A2}$ is injected into or otherwise drawn from the transmission antenna 20.

A third switch SW3 and the second auxiliary coil $L_{A2}$ are arranged in series between the first terminal 31 and the second terminal 32. A fourth switch SW4 is arranged in parallel with the second auxiliary coil $L_{A2}$. In the first state φ1, a control unit 40a turns on the fourth switch SW4. In the second state φ2, the control unit 40a turns on the third switch SW3.

Figure 10:
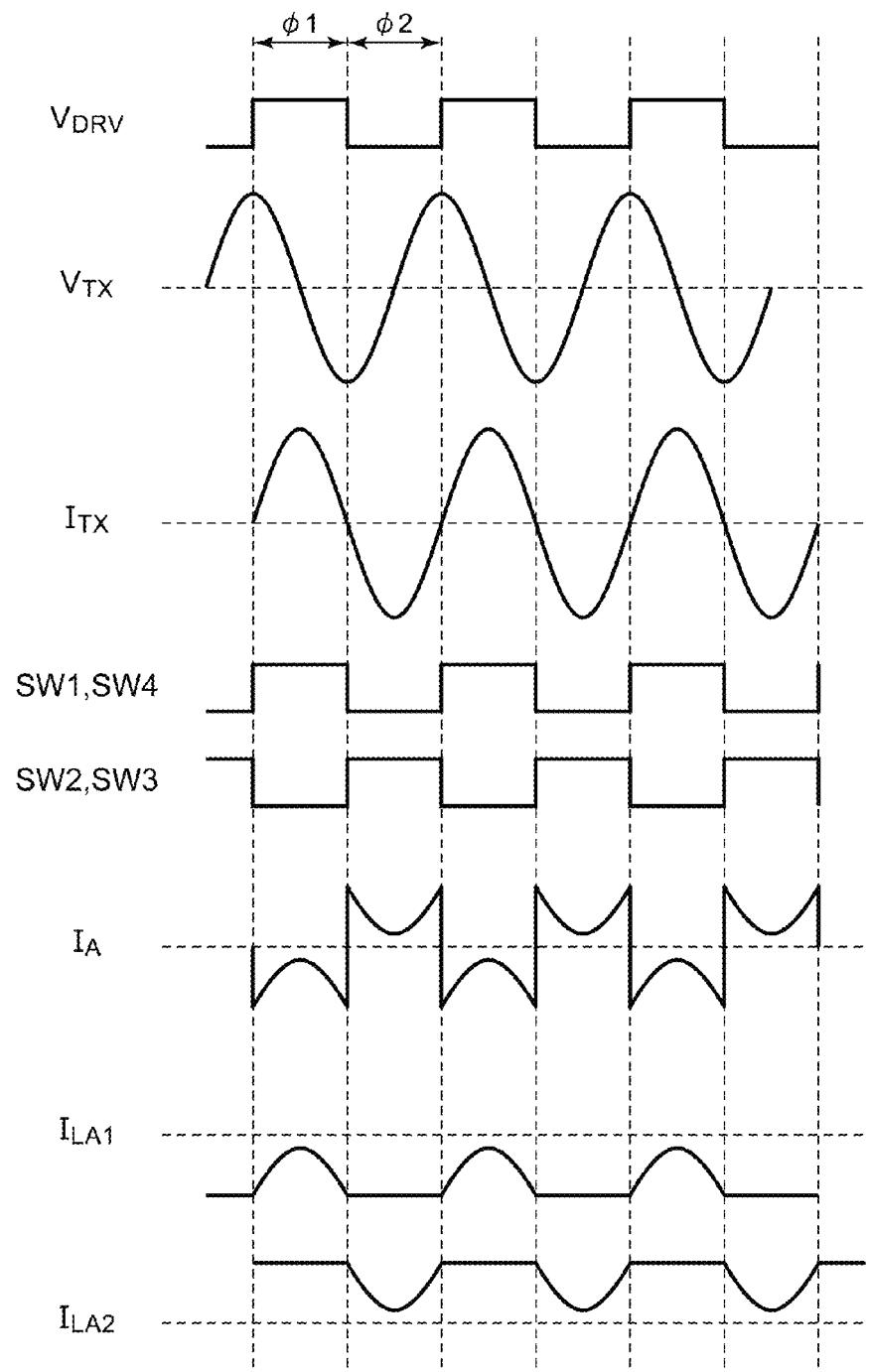
FIG. 10 is a waveform diagram showing the operation of the automatic tuning assist circuit shown in FIG. 9.

FIG. 10 is a waveform diagram showing the operation of the automatic tuning assist circuit 30a shown in FIG. 9. It should be noted that FIG. 10 shows the waveforms of the resonance current $I_{TX}$ and the resonance voltage $V_{TX}$ obtained after a sufficient time has elapsed after the automatic tuning assist circuit 30a starts to operate.

The automatic tuning assist circuit 30a shown in FIG. 9 can be regarded as an arrangement comprising two automatic tuning assist circuits 30 shown in FIG. 2, which are configured to operate with reverse phases. With such an arrangement, the correction current $I_{A1}$ supplied by the first auxiliary coil $L_{A1}$ and the correction current $I_{A2}$ supplied by the second auxiliary coil $L_{A2}$ have opposite polarities. The correction current $I_A$ supplied to the transmission antenna 20 is configured as the sum of the two correction currents $I_{A1}$ and $I_{A2}$.

With the automatic tuning assist circuit 30a shown in FIG. 9, such an arrangement also provides a quasi-resonant state.

Second Modification

Figure 11A:
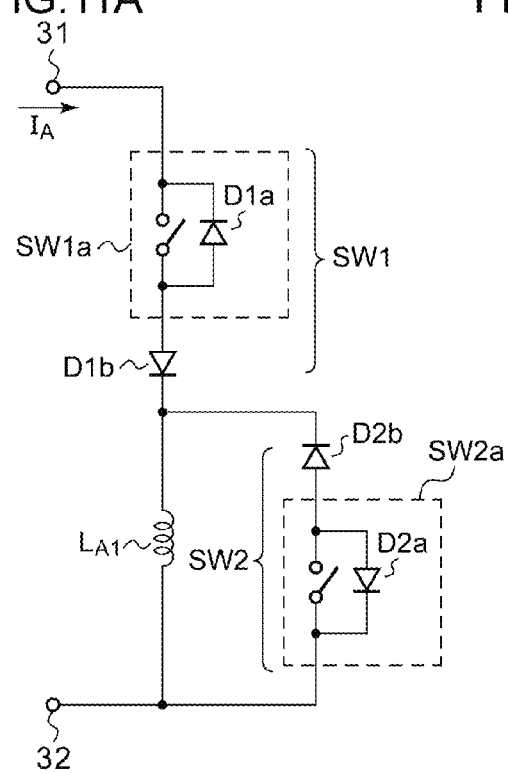
FIGS. 11A and 11B are circuit diagrams each showing a configuration of an automatic tuning assist circuit according to a second modification.
Figure 11B:
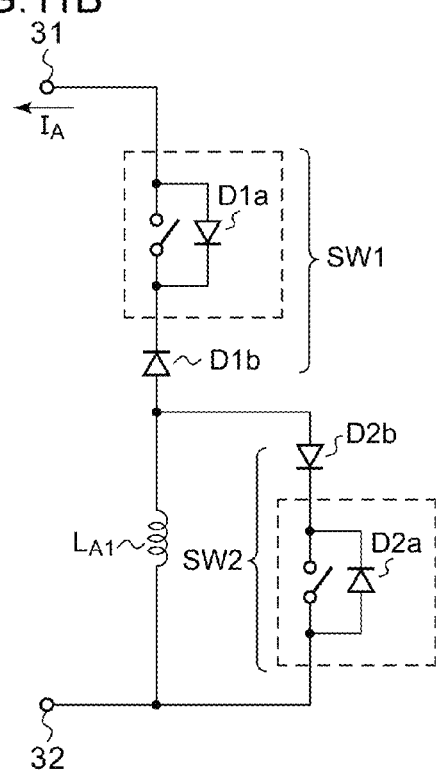

With a second modification, the first switch SW1 and the second switch SW2 are each configured using a uni-directional switch. FIGS. 11A and 11B are circuit diagrams each showing a configuration of an automatic tuning assist circuit according to the second modification.

In FIGS. 11A and 11B, the first switch SW1 includes a uni-directional switch SW1a and a rectifier diode D1b arranged in series with the uni-directional switch SW1a. The rectifier diode D1b is arranged in a direction that is the reverse of the forward direction of a parasitic diode (body diode) D1a configured as an inversely conducting element formed in the uni-directional switch SW1a. The switch SW1a and the rectifier diode D1b may be mutually exchanged.

The second switch SW2 has the same configuration as that of the switch SW1. That is to say, the second switch SW2 includes a uni-directional switch SW2a and a rectifier diode D2b arranged in series with the uni-directional switch SW2a. The rectifier diode D2b is arranged in a direction that is the reverse of the forward direction of a parasitic diode (body diode) D2a configured as an inversely conducting element formed in the uni-directional switch SW2a. The switch SW2a and the rectifier diode D2b may be mutually exchanged.

By arranging the rectifier diodes D1b and D2b in directions that are the reverse of the forward directions of the parasitic diodes D1a and D2a, such an arrangement is capable of preventing the first switch SW1 and the second switch SW2 from turning on at an unintended timing.

It should be noted that, in a case in which the first switch SW1 and the second switch SW2 are each configured as a bi-directional switch, the automatic tuning assist circuit 30 allows the correction voltage $I_A$ to have both a positive value and a negative value. In contrast, the automatic tuning assist circuit 30 shown in FIG. 11A is capable of generating the correction current $I_A$ having a positive value. However, the automatic tuning assist circuit 30 cannot generate the correction current $I_A$ having a negative value. Conversely, the automatic tuning assist circuit 30 shown in FIG. 11B is capable of generating the correction current $I_A$ having a negative value. However, the automatic tuning assist circuit 30 cannot generate the correction current $I_A$ having a positive value. That is to say, with the automatic tuning assist circuits 30 shown in FIGS. 11A and 11B, the switching phases of the first switch SW1 and the second switch SW2 are restricted.

Third Modification

Figure 12:
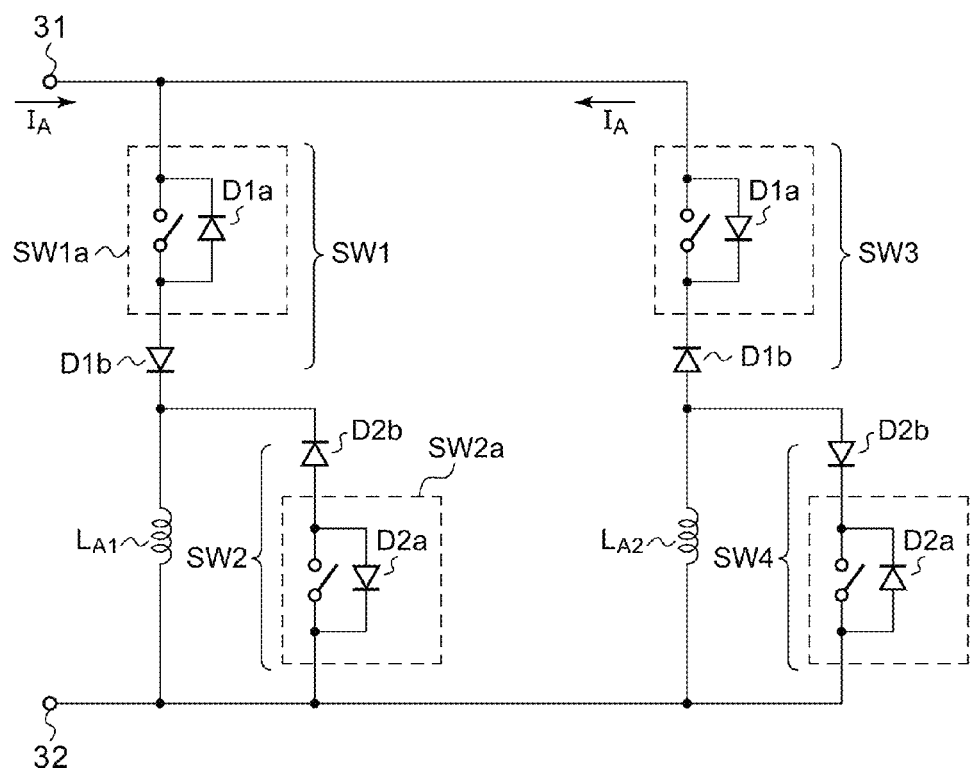
FIG. 12 is a circuit diagram showing a configuration of an automatic tuning assist circuit according to a third modification.

Also, the automatic tuning assist circuit 30a shown in FIG. 9 may be configured using a uni-directional switch. FIG. 12 is a circuit diagram showing a configuration of an automatic tuning assist circuit according to a third modification. In the automatic tuning assist circuit 30a shown in FIG. 12, the first switch SW1 and the second switch SW2 are each configured in the same way as shown in FIG. 11A. The third switch SW3 and the fourth switch SW4 are each configured in the same way as shown in FIG. 11B. With the automatic tuning assist circuit 30a shown in FIG. 12, such an arrangement also provides the same advantages as those provided by the automatic tuning assist circuit 30a shown in FIG. 9.

Second Embodiment

Figure 13:
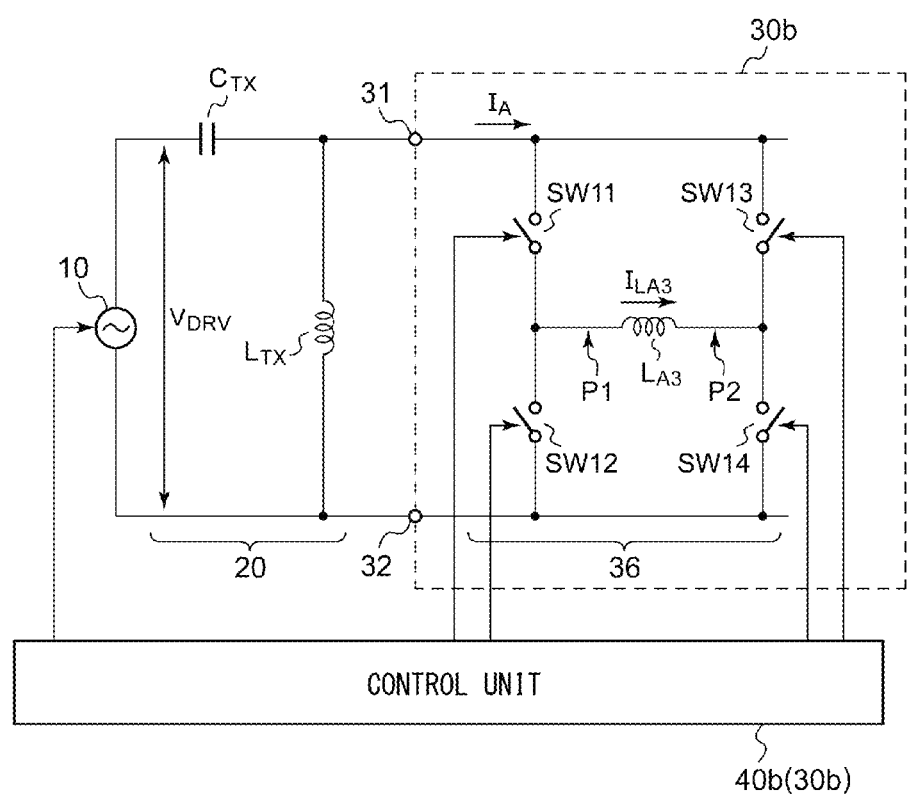
FIG. 13 is a circuit diagram showing a configuration of a wireless power supply transmitter including an automatic tuning assist circuit according to a second embodiment.

FIG. 13 is a circuit diagram showing a configuration of a wireless power supply transmitter 2b including an automatic tuning assist circuit 30b according to a second embodiment. The automatic tuning assist circuit 30b is coupled with the transmission antenna 20. The automatic tuning assist circuit 30b injects the correction current $I_A$ into the transmission antenna 20, or otherwise draws the correction current $I_A$ from the transmission antenna 20.

The automatic tuning assist circuit 30b includes: a first terminal 31 and a second terminal 32 coupled with the transmission antenna 20; an H-bridge circuit 36; a third auxiliary coil $L_{A3}$, and a control unit 40b. The H-bridge circuit 36 is arranged between the first terminal 31 and the second terminal 32. The H-bridge circuit 36 is switched on and off with the same frequency as that of the driving voltage $V_{DRV}$. The third auxiliary coil $L_{A3}$ is arranged between the output terminals P1 and P2 of the H-bridge circuit 36. The control unit 40b switches on and off the H-bridge circuit 36 with a predetermined phase difference $\theta_{TX}$ with respect to the driving voltage $V_{DRV}$.

Figure 14:
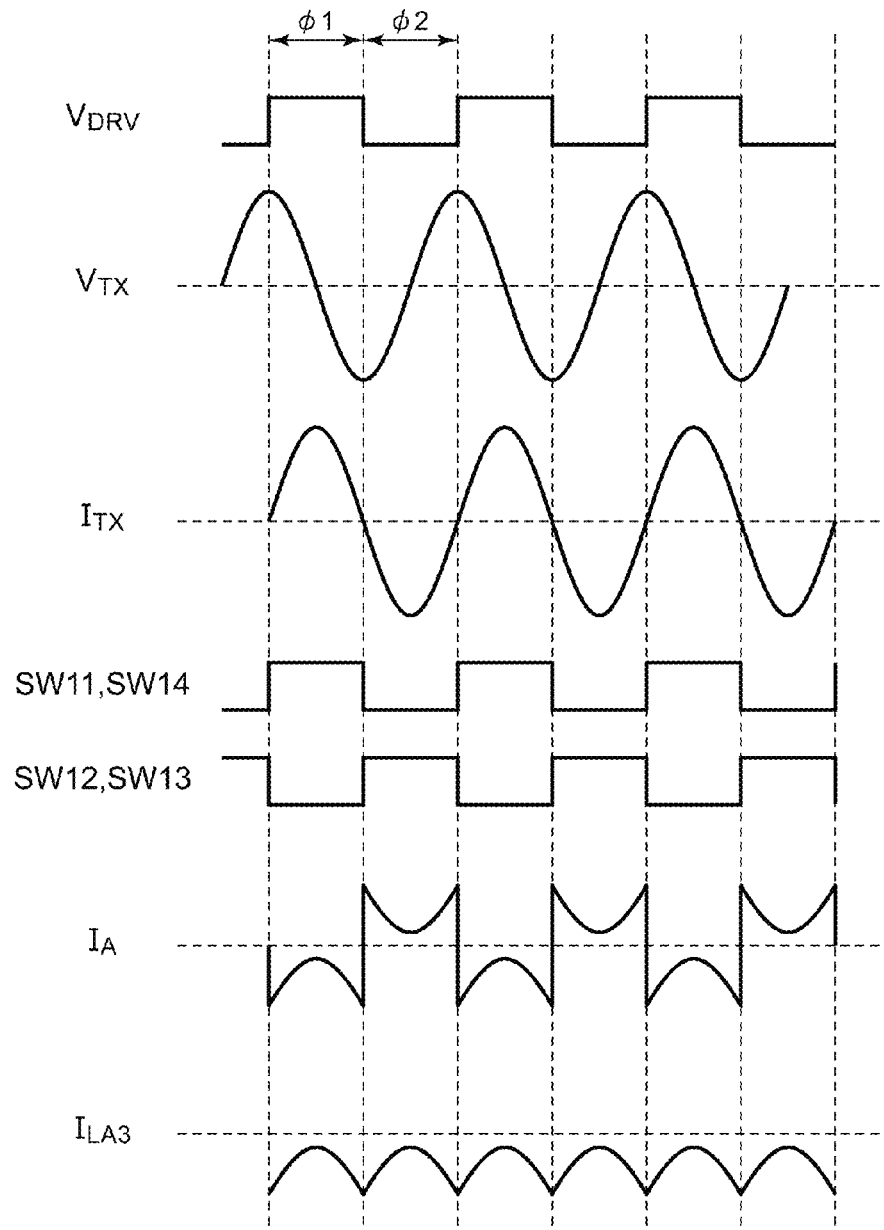
FIG. 14 is a waveform diagram showing the operation of the wireless power receiver shown in FIG. 13.

FIG. 14 is a waveform diagram showing the operation of the wireless power supply transmitter 2 shown in FIG. 13. The H-bridge circuit 36 in FIG. 14 performs switching with the same phase ($\theta_{TX}=0$ degrees) as that of the driving voltage $V_{DRV}$.

During the half period from a predetermined phase of the driving voltage $V_{DRV}$, of the four switches SW11 through SW14 of the H-bridge circuit 36, a first pair of oppositely positioned switches SW11 and SW14 are turned on. Furthermore, during the following half period, a second pair of switches SW12 and SW13 are turned on. In the half period in which the first pair of switches SW11 and SW14 are turned on, the current $I_{LA3}$ that flows through the third auxiliary coil $L_{A3}$ is supplied to the transmission antenna 20 in a first direction In the half period in which the second pair of switches SW12 and SW13 are turned on, the current $I_{LA3}$ that flows through the third auxiliary coil $L_{A3}$ is supplied to the transmission antenna 20 in a second direction.

The switches SW11 through SW14 may each be configured using a uni-directional switch or otherwise a bi-directional switch. Here, description will be made regarding the configuration and the operation of an arrangement employing bi-directional switches. It should be noted that, in a case of employing such uni-directional switches, there is a need to arrange a rectifier diode in series with each of the switches SW11 through SW14. Description will be made later regarding such a modification.

The operation and mechanism of the automatic tuning assist circuit 30b shown in FIG. 13 are the same as those of the automatic tuning assist circuit shown in FIG. 2 or FIG. 9. The automatic tuning assist circuit 30b generates a correction current $I_A$ having the same waveform as that of the correction current $I_A$ shown in FIG. 10. The wireless power supply transmitter 2b shown in FIG. 13 also provides the same advantages as those provided by the wireless power supply transmitter described above.

Furthermore, with the automatic tuning assist circuit 30b shown in FIG. 13, such an arrangement requires only a single coil to provide the same advantages as those provided by the automatic tuning assist circuit 30a shown in FIG. 9.

Next, description will be made regarding a modification of the automatic tuning assist circuit 30b according to the second embodiment.

Figure 15:
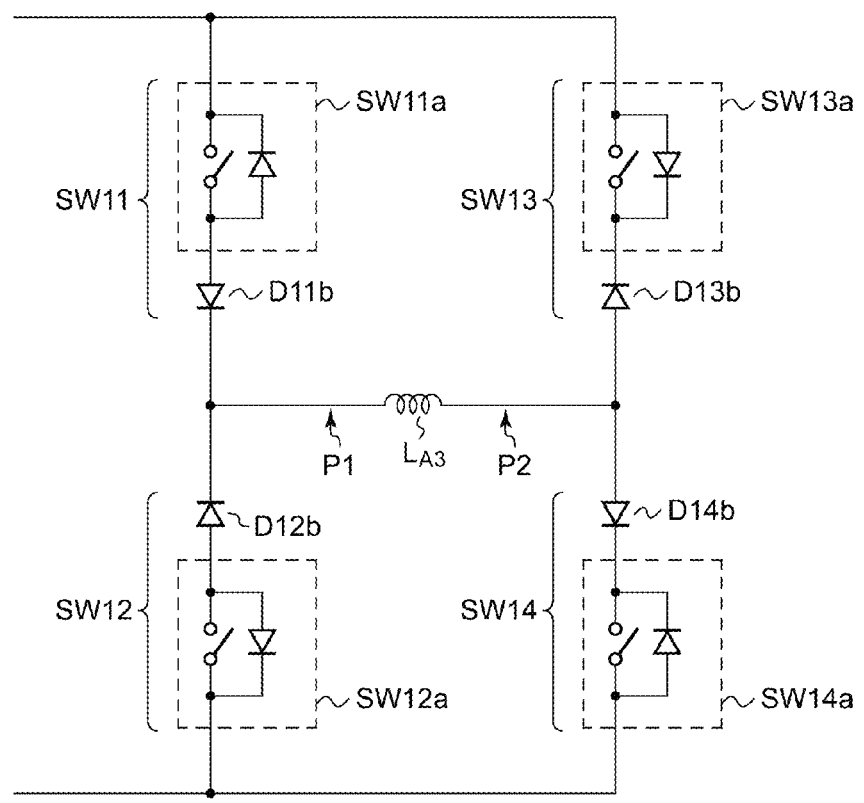
FIG. 15 is a circuit diagram showing a modification of the automatic tuning assist circuit shown in FIG. 13.

FIG. 15 is a circuit diagram showing a modification of the automatic tuning assist circuit 30b shown in FIG. 13. In this modification, the switches SW11 through SW14 are each configured using a uni-directional switch.

The switches SW11 through SW14 each have the same configuration as that described with reference to FIGS. 11A, 11B, or FIG. 12. The switches SW11 and SW12 each have the same configuration as that of the switches SW1 and SW2 shown in FIG. 11A. The switches SW13 and SW14 each have the same configuration as that of the switches SW1 and SW2 shown in FIG. 11B.

Such a modification shown in FIG. 15 provides the same advantages as those provided by the automatic tuning assist circuit 30b shown in FIG. 13.

Various modifications may be made with respect to the configuration of the coupling between the automatic tuning assist circuit 30, 30a, or 30b (which will simply be referred to as the "automatic tuning assist circuit 30" hereafter) and the transmission antenna 20. FIGS. 16A through 16G are circuit diagrams each showing the configuration of a coupling between the automatic tuning assist circuit 30 and the transmission antenna 20.

The automatic tuning assist circuits 30 in FIGS. 16A through 16D are directly coupled with the transmission antenna 20. The automatic tuning assist circuits 30 in FIGS. 16E and 16F are magnetically coupled with the transmission antenna 20.

Figure 16A:
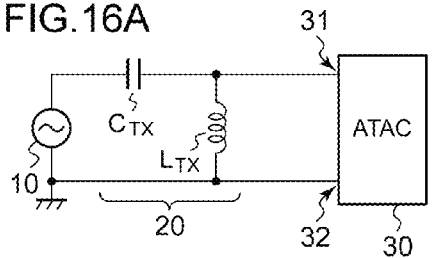
FIGS. 16A through 16G are circuit diagrams each showing a configuration of coupling between an automatic tuning assist circuit and a transmission antenna.
Figure 16B:
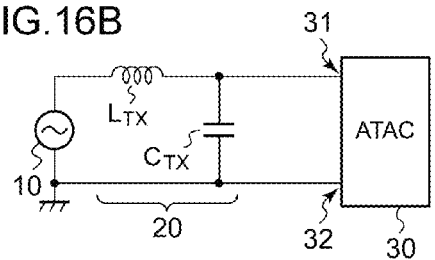

FIG. 16A shows the same configuration as shown in FIG. 2 or 9. The automatic tuning assist circuit 30 in FIG. 16B is coupled with the resonance capacitor $C_{TX}$. Specifically, the first terminal 31 of the automatic tuning assist circuit 30 is connected to one end of the resonance capacitor $C_{TX}$. Furthermore, the second terminal 32 of the automatic tuning assist circuit 30 is connected to the other end of the resonance capacitor $C_{TX}$.

Figure 16C:
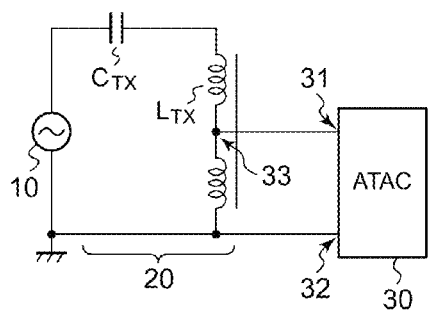

A tap 33 is provided to the transmission coil $L_{TX}$ in FIG. 16C. The first terminal 31 of the automatic tuning assist circuit 30 is connected to the tap 33. Furthermore, the second terminal 32 is connected to the other end of the transmission coil $L_{TX}$.

Figure 16D:
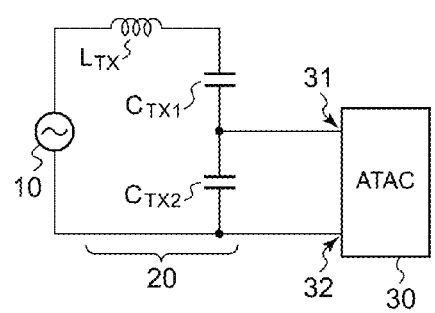
Figure 16E:
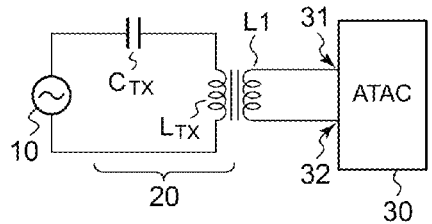
Figure 16F:
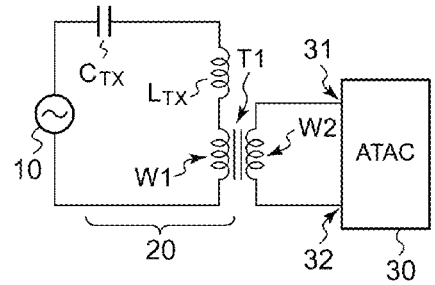

The transmission antenna 20 shown in FIG. 16D includes two resonance capacitors $C_{TX1}$ and $C_{TX2}$ arranged in series with the transmission coil $L_{TX}$. The first terminal 31 of the automatic tuning assist circuit 30 is connected to one end of one of the resonance capacitors, i.e., the resonance capacitor $C_{TX2}$. Furthermore, the second terminal 32 is connected to the other end of the resonance capacitor $C_{TX2}$.

The wireless power supply transmitter shown in FIG. 16E further includes a first coil L1 magnetically coupled with the transmission coil $L_{TX}$. The first terminal 31 of the automatic tuning assist circuit 30 is connected to one end of the first coil L1. Furthermore, the second terminal 32 of the automatic tuning assist circuit 30 is connected to the other end of the first coil L1.

The wireless power supply transmitter shown in FIG. 16F further includes a transformer T1. The primary winding W1 of the transformer T1 is arranged in series with the transmission antenna $L_{TX}$. The first terminal 31 of the automatic tuning assist circuit 30 is connected to one end of the secondary winding W2 of the transformer T1. Furthermore, the second terminal 32 of the automatic tuning assist circuit 30 is connected to the other end of the secondary winding W2.

Figure 16G:
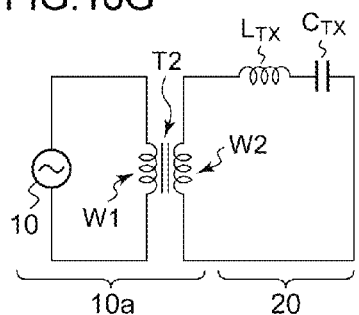

In the wireless power supply transmitter 2 shown in FIG. 16G, the power supply 10 and the transmission antenna 20 are coupled with each other via a transformer T2. From another viewpoint, the power supply 10 and the transformer T2 provide a power supply 10a configured to apply the driving voltage $V_{DRV}$ between both ends of the transmission antenna 20. It should be noted that, in FIG. 16G, the automatic tuning assist circuit is not shown. The automatic tuning assist circuit may be coupled with the transmission antenna 20 using any one of the coupling configurations shown in FIGS. 16A through 16F.

With such modifications shown in FIG. 16A through 16G, or with other circuits similar to such modifications, such an arrangement also provides a quasi-resonant state.

In addition, with the configurations shown in FIGS. 16C through 16F, such an arrangement allows the voltage between the terminals 31 and 32 of the automatic tuning assist circuit 30 to be reduced, as compared with the configurations shown in FIGS. 16A and 16B. Thus, such an arrangement allows a low breakdown voltage element to be employed as a switch which is a component of the automatic tuning assist circuit 30. This facilitates the circuit design, or this provides a reduced cost.

Description has been made in the first and second embodiments regarding the wireless power supply transmitter including the automatic tuning assist circuit configured to operate with a switching frequency which is equal to the frequency of the driving voltage $V_{DRV}$. However, the automatic turning assist circuit may be configured to operate with a switching frequency that differs from the frequency of the driving voltage $V_{DRV}$, which also provides a quasi-resonant state. For example, the automatic tuning assist circuit 30 may be configured to operate with a switching frequency obtained by multiplying or otherwise dividing the frequency of the driving voltage $V_{DRV}$ by an odd number. The relation between the switching frequency and the frequency of the driving voltage may preferably be determined giving consideration to the overall efficiency of the system, etc.

[Wireless Power Receiver]

The aforementioned automatic tuning assist circuit may be employed in a wireless power receiver. Description will be made regarding such a wireless power receiver.

First Embodiment

Figure 17:
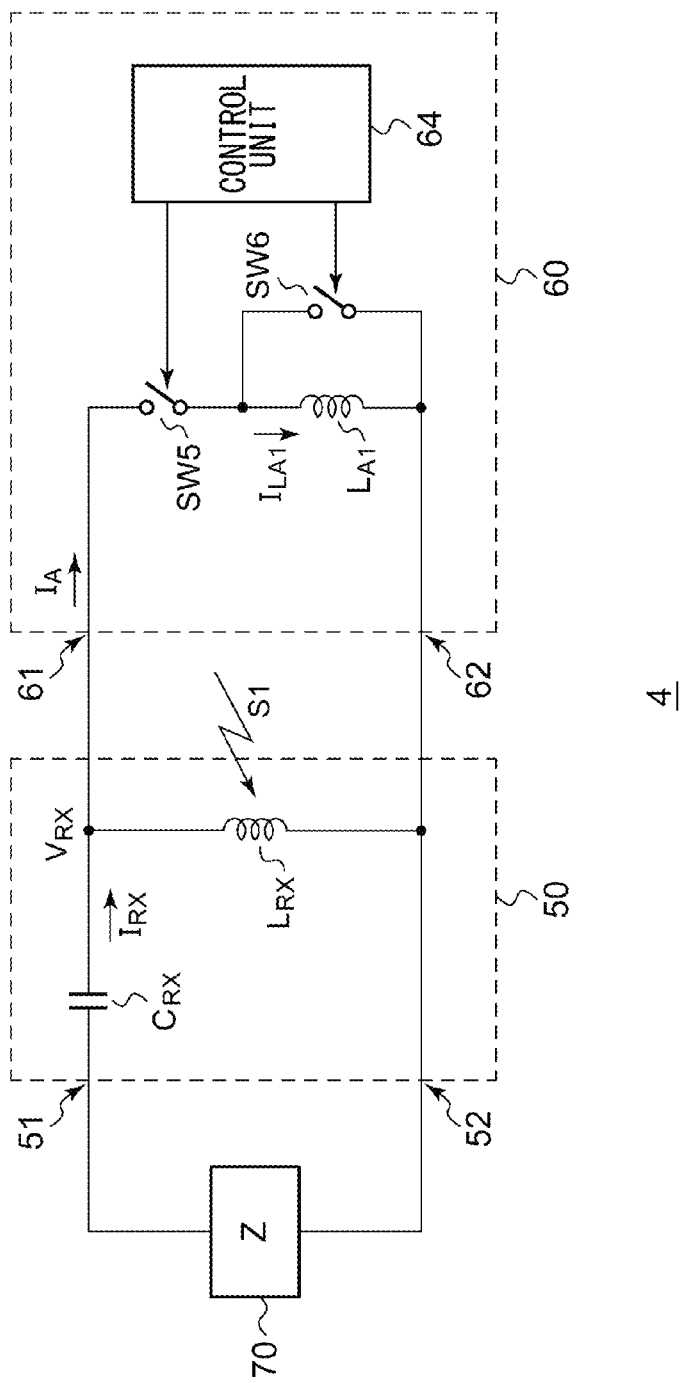
FIG. 17 is a circuit diagram showing a configuration of a wireless power receiver according the first embodiment.

FIG. 17 is a circuit diagram showing a configuration of a wireless power receiver 4 according to the first embodiment. The wireless power receiver 4 receives the electric power signal S1 transmitted from the aforementioned wireless power supply transmitter or otherwise a wireless power supply transmitter having an entirely different configuration. The electric power signal S1 is configured using the near-field components (electric field, magnetic field, or electromagnetic field) of electromagnetic waves that have not yet become radio waves.

The wireless power receiver 4 includes a reception antenna 50, an automatic tuning assist circuit 60, and a load 70 to be supplied with electric power. The load 70 may include an unshown rectifier circuit, detector circuit, or the like, as a built-in component.

The reception antenna 50 includes a reception coil $L_{RX}$ and a resonance capacitor $C_{RX}$ arranged in series between a first terminal 51 and a second terminal 52.

The automatic tuning assist circuit 60 is coupled with the reception antenna 50. The automatic tuning assist circuit 60 injects the first correction current $I_A$ into, or otherwise draws the first correction current $I_A$ from, the reception antenna 50.

The automatic tuning assist circuit 60 includes a first terminal 61, a second terminal 62, a first auxiliary coil $L_{A1}$, a fifth switch SW5, a sixth switch SW6, and a control unit 64. The automatic tuning assist circuit 60 has the same configuration as that of the automatic tuning assist circuit 30 described above.

The automatic tuning assist circuit 60 repeatedly switches between a first state φ1 and a second state φ2 with the same frequency as that of the electric power signal S1. In the first state φ1, the fifth switch SW5 is turned on, which couples the first auxiliary coil $L_{A1}$ with the reception antenna 50. In this state, the first correction current $I_A$ that corresponds to the current $I_{LA1}$ that flows through the first auxiliary coil $L_{A1}$ is injected into, or otherwise drawn from, the reception antenna 50.

In the second state φ2, the sixth switch SW6 is turned on. Furthermore, the first auxiliary coil $L_{A1}$ is decoupled from the reception antenna 50. In this state, the current $I_{LA1}$ that flows through the first auxiliary coil $L_{A1}$ flows through a current path (SW6) which is independent of the reception antenna 50.

The control unit 64 may switch between the first state ϕ1 and the second state ϕ2 with the same frequency as that of the driving voltage applied to the transmission antenna included in a wireless power supply transmitter (not shown), and with a predetermined phase difference with respect to the driving voltage.

The fifth switch SW5 and the sixth switch SW6 are each configured as a uni-directional switch or otherwise a bi-directional switch. In a case in which these switches are each configured as a uni-directional switch, the control unit 64 switches each switch such that no current flows through the inversely conducting element formed in each switch.

The load 70 is coupled with the reception antenna 50. The configuration of the coupling between the load 70 and the reception antenna 50 is not restricted in particular.

Figure 18:
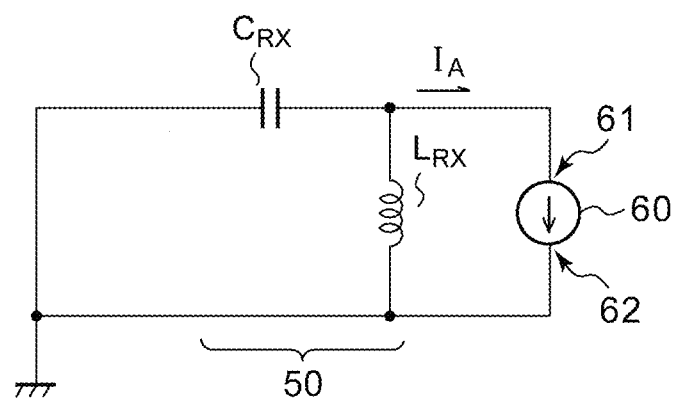
FIG. 18 is an equivalent circuit diagram of the wireless power receiver shown in FIG. 17.

The above is the configuration of the wireless power receiver 4. Next, description will be made regarding the operation thereof. FIG. 18 is an equivalent circuit diagram of the wireless power receiver 4 shown in FIG. 17. As with the automatic tuning assist circuit 30 of the wireless power supply transmitter 2, the automatic tuning assist circuit 60 can be regarded as a correction current source configured to supply the correction current $I_A$ to the reception antenna 50.

Figure 19:
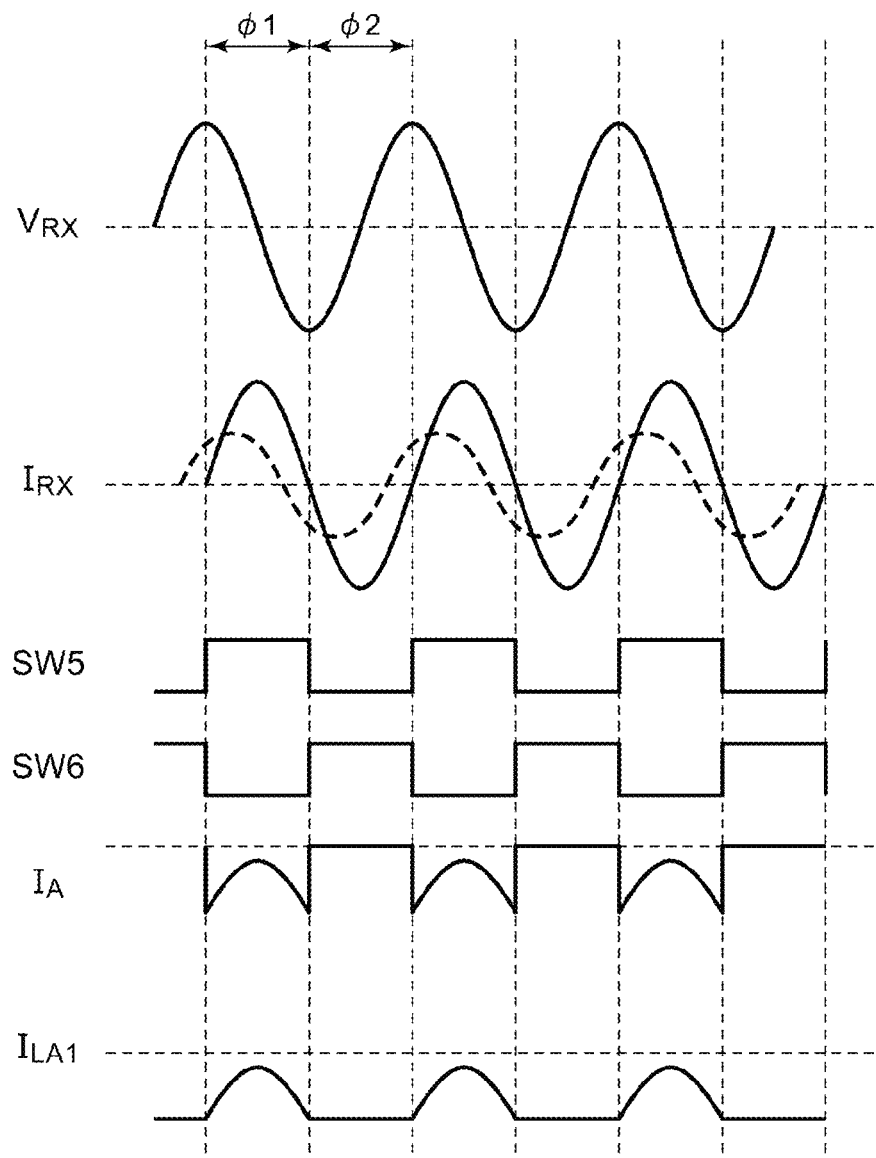
FIG. 19 is a waveform diagram showing the operation of the wireless power receiver shown in FIG. 17.

FIG. 19 is a waveform diagram showing the operation of the wireless power receiver 4 shown in FIG. 17. FIG. 19 shows, in the following order beginning from the top, the resonance voltage $V_{RX}$ between a circuit formed of the reception coil $L_{RX}$ and the resonance capacitor $C_{RX}$, the resonance current $I_{RX}$ that flows through the reception antenna 50, the voltage at the fifth switch SW5, the voltage at the sixth voltage SW6, the correction current $I_A$, and the current $I_{LA1}$ that flows through the first auxiliary coil $L_{A1}$. In the waveform diagrams showing the resonance current $I_{RX}$ and the resonance voltage $V_{RX}$, the solid line represents the waveform of a steady state (quasi-resonant state) after a sufficient period of time elapses after the automatic tuning assist circuit 60 starts to operate, and the broken line represents the waveform of a non-resonant state when the automatic tuning assist circuit 60 does not operate.

In order to provide a quasi-resonant state, there is a need to switch on and off the fifth switch SW5 and the sixth switch SW6 with a suitable frequency $f_{TX}$ and with a suitable phase $\theta_{RX}$. In order to meet this requirement, the wireless power supply transmitter 2 may be configured to transmit the data which represents the frequency $f_{TX}$ and the phase $\theta_{RX}$ to the wireless power receiver 4. Also, the wireless power receiver 4 may be configured to sweep the phase $\theta_{RX}$ so as to detect the optimum phase $\theta_{RX}$.

The above is the operation of the wireless power receiver 4.

As described above, with the wireless power receiver 4 shown in FIG. 17, such an arrangement automatically provides a resonant state without a need to adjust the capacitance of the resonance capacitor $C_{RX}$.

Next, description will be made regarding modifications of the wireless power receiver 4.

First Modification

Figure 20:
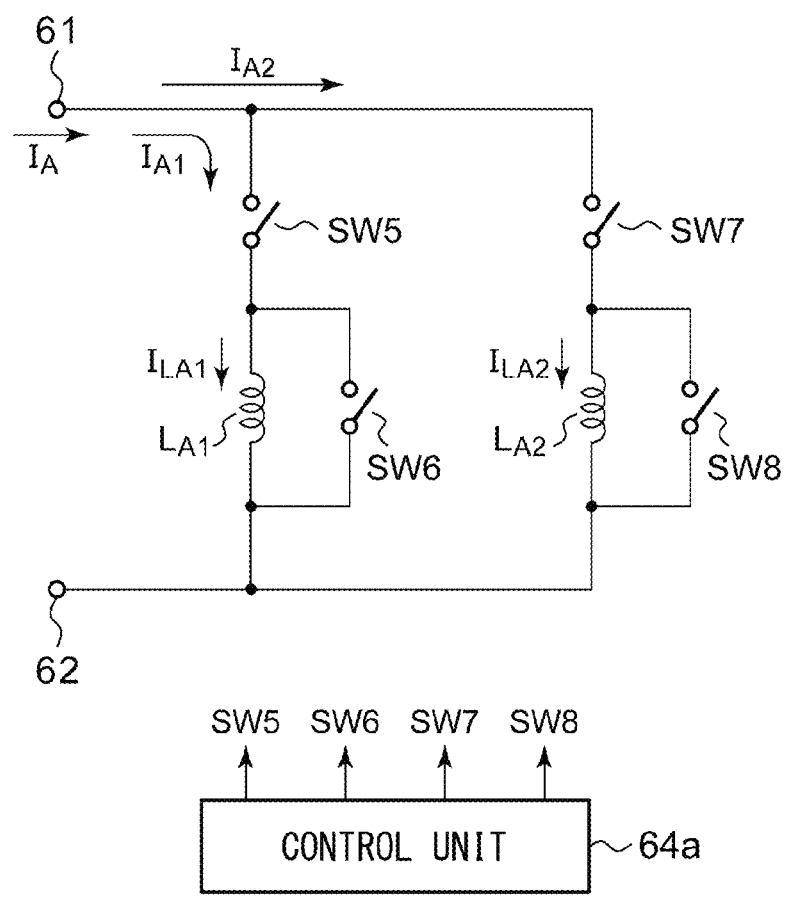
FIG. 20 is a circuit diagram showing a configuration of a wireless power receiver according to a first modification.

FIG. 20 is a circuit diagram showing a configuration of an automatic tuning assist circuit 60a according to a first modification. The automatic tuning assist circuit 60a has the same configuration as that of the automatic tuning assist circuit 30a shown in FIG. 9. The automatic tuning assist circuit 60a includes a seventh switch SW7, an eighth switch SW8, and a second auxiliary coil $L_{A2}$, in addition to the configuration of the automatic tuning assist circuit 60 shown in FIG. 17. Such a modification provides a quasi-resonant state in the same way as with the wireless power receiver 4 shown in FIG. 17.

Second Modification

In the same way as the wireless power transmitting apparatus 2, the switches of the wireless power receiver 4 may each be configured using a uni-directional switch. In a wireless power receiver 4a according to a second modification, the automatic tuning assist circuit 60 is configured using uni-directional switches. Specifically, the switches of the automatic tuning assist circuit 60 have the same configuration as that of the automatic tuning assist circuit 30 shown in FIGS. 11A and 11B.

Third Modification

The wireless power receiver 4 may be effectively configured by making a combination of the first modification and the second modification. The automatic tuning assist circuit 60 according to a third modification has the same configuration as that of the automatic tuning assist circuit 30 shown in FIG. 12.

Second Embodiment

Figure 21:
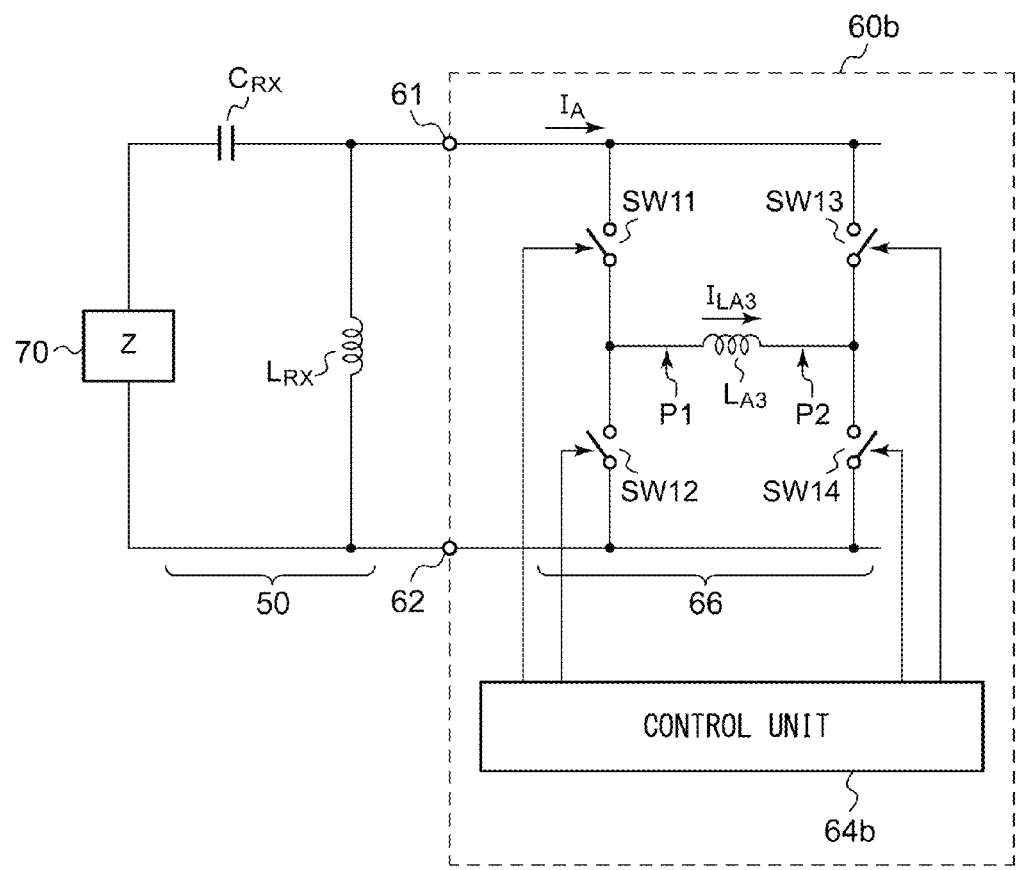
FIG. 21 is a circuit diagram showing a configuration of a wireless power receiver according to the second embodiment.

FIG. 21 is a circuit diagram showing a configuration of a wireless power receiver 4b according to a second embodiment. The wireless power receiver 4b includes an automatic tuning assist circuit 60b. The automatic tuning assist circuit 60b includes an H-bridge circuit 66 and a second control unit 64b in the same way as with the automatic tuning assist circuit 30b shown in FIG. 13. The second control unit 64b switches between a first state in which a first pair of switches SW11 and SW14 of the H-bridge circuit 66 are turned on and a second state in which a second pair of switches SW12 and SW13 are turned on, with the same frequency as that of the electric power signal S1.

The automatic tuning assist circuit 60b shown in FIG. 21 requires only a single auxiliary coil to provide the same functions as those provided by the first or third modification of the first embodiment.

In the wireless power receiver 4 according to the second embodiment, uni-directional switches may also be employed. In this modification, the automatic tuning assist circuit 60b may preferably be configured in the same manner as the automatic tuning assist circuit 30b shown in FIG. 15.

Figure 22A:
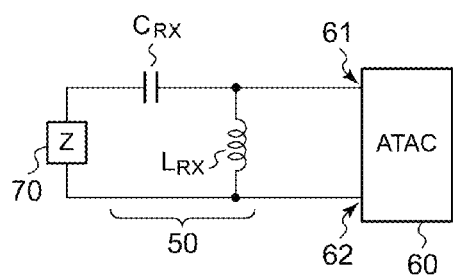
FIGS. 22A through 22F are circuit diagrams each showing a configuration of coupling between an automatic tuning assist circuit and a reception antenna.
Figure 22B:
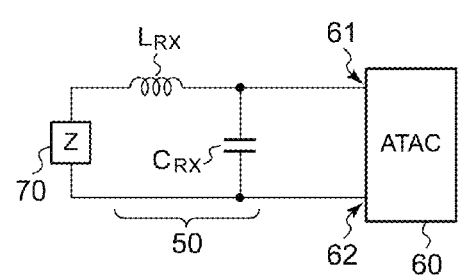
Figure 22C:
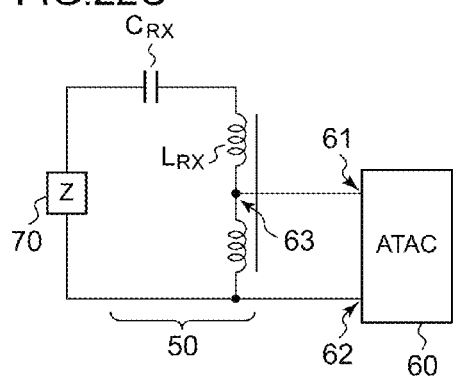
Figure 22D:
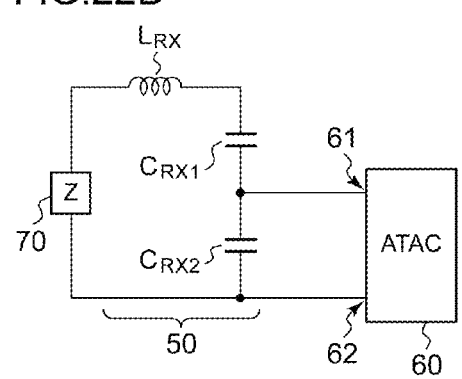
Figure 22E:
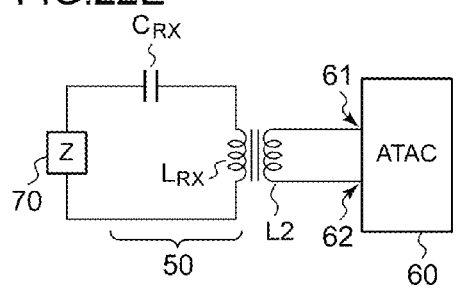
Figure 22F:
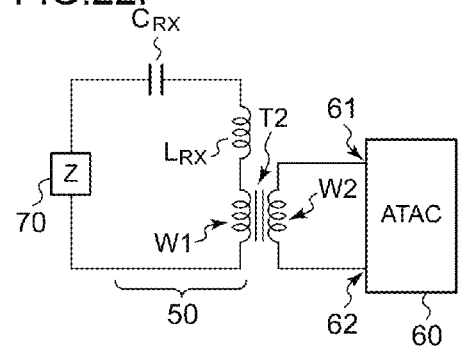

FIGS. 22A through 22F are circuit diagrams each showing a configuration of coupling between the automatic tuning assist circuit 60 and the reception antenna 50. FIGS. 22A through 22F correspond to FIGS. 16A through 16F, respectively. In FIGS. 22A through 22D, the automatic tuning assist circuit 60 is directly coupled with the reception antenna 50. In FIGS. 22E and 22F, the automatic tuning assist circuit 60 is magnetically coupled with the reception antenna 50.

FIG. 22A shows the same configuration as shown in FIG. 17. The automatic tuning assist circuit 60 in FIG. 22B is coupled with the resonance capacitor $C_{RX}$. A tap 63 is provided to the reception coil $L_{RX}$ in FIG. 22C. The first terminal 61 of the automatic tuning assist circuit 60 is connected to the tap 63. Furthermore, the second terminal 62 is connected to one end of the reception coil $L_{RX}$.

The reception antenna 50 in FIG. 22D includes two resonance capacitors $C_{RX1}$ and $C_{RX2}$ arranged in series with the reception coil $L_{RX}$. The first terminal 61 of the automatic tuning assist circuit 60 is connected to one end of the resonance capacitor $C_{RX2}$, which is one of the aforementioned resonance capacitors. Furthermore, the second terminal 62 is connected to the other end of the resonance capacitor $C_{RX2}$.

The wireless power receiver in FIG. 22E further includes a second coil L2 magnetically coupled with the reception coil $L_{RX}$. The first terminal 61 of the automatic tuning assist circuit 60 is connected to one end of the second coil L2. Furthermore, the second terminal 62 is connected to the other end of the second coil L2.

The wireless power receiver in FIG. 22F further includes a transformer T2. The primary winding W1 of the transformer T2 is arranged in series with the reception antenna $L_{RX}$. The first terminal 61 of the automatic tuning assist circuit 60 is connected to one end of the secondary winding W2 of the transformer T2. Furthermore, the second terminal 62 is connected to the other end of the secondary winding W2.

With such modifications shown in FIGS. 22A through 22F or with other circuits similar to these modifications, such an arrangement also provides a quasi-resonant state.

In addition, with the configuration shown in FIGS. 22C through 22F, such an arrangement allows the voltage between the terminals 61 and 62 of the automatic tuning assist circuit 60 to be reduced, as compared with the configurations shown in FIGS. 22A and 22B. Thus, such an arrangement allows a low breakdown voltage element to be employed as a switch which is a component of the automatic tuning assist circuit 60. This facilitates the circuit design, or this provides a reduced cost.

Description has been made in the first and second embodiments regarding the wireless power receiver including the automatic tuning assist circuit configured to operate with a switching frequency which is equal to the frequency of the electric power signal. However, the automatic turning assist circuit may be configured to operate with a switching frequency that differs from the frequency of the electric power signal, which also provides a quasi-resonant state. For example, the automatic tuning assist circuit 60 may be configured to operate with a switching frequency obtained by multiplying or otherwise dividing the frequency of the electric power signal S2 by an odd number, which also provides a quasi-resonant state. The relation between the switching frequency and the frequency of the driving voltage may preferably be determined giving consideration to the overall efficiency of the system, etc.

[Wireless Power Transmission System]

By combining the wireless power transmission apparatus and the wireless power receiver described above, such an arrangement provides a wireless power transmission system.

By respectively providing the automatic tuning assist circuits 30 and 60 to the wireless power supply transmitter 2 and the wireless power receiver 4, such an arrangement allows the maximum electric power to be transmitted to the load 70. It is needless to say that any one of the aforementioned wireless power supply transmitteres 2 including the modifications thereof may be combined with any one of the aforementioned wireless power receiveres 4 including the modifications thereof.

It should be noted that both the wireless power supply transmitter 2 and the wireless power receiver 4 do not necessarily require such an automatic tuning assist circuit. Also, an arrangement may be made in which such an automatic tuning assist circuit 30 is provided to only the wireless power supply transmitter 2, and the wireless power receiver 4 adjusts the resonance capacitor $C_{RX}$ in the same way as with conventional techniques.

Conversely, an arrangement may be made in which such an automatic tuning assist circuit 60 is provided to only the wireless power receiver 4, and the wireless power supply transmitter 2 adjusts the resonance capacitor $C_{TX}$ in the same way as with conventional techniques.

Also, an arrangement may be made in which such an automatic tuning assist circuit 30 is provided to only the wireless power supply transmitter 2, and the wireless power receiver 4 has no adjustment mechanism. Alternatively, an arrangement may be made in which such an automatic tuning assist circuit 60 is provided to only the wireless power receiver 4, and the wireless power supply transmitter 2 has no adjustment mechanism.

With such arrangements, tuning is performed by means of a single automatic tuning assist circuit so as to provide impedance matching between the power supply 10 and the load 70, thereby providing high-efficiency electric power transmission.

Description has been made regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

With the wireless power supply transmitter 2 including the automatic tuning assist circuit 30, in some cases, such an arrangement is capable of providing a quasi-resonant state even without including the resonance capacitor $C_{TX}$. In this case, such a resonance capacitor $C_{TX}$ may be omitted. In the same way, an arrangement may be made in which the wireless power receiver 4 including the automatic tuning assist circuit 60 does not include the resonance capacitor $C_{RX}$.

The wireless power supply transmitter 2 encrypts the electric power signal S1 by changing at least one of the frequency $f_{TX}$ and the phase of the driving voltage $V_{DRV}$ according to a predetermined rule (encryption code). In a case in which the wireless power receiver 4 knows the encryption code, the wireless power receiver 4 controls the switching frequency and phase of the automatic tuning assist circuit 60 based on the encryption code. As a result, even if the electric power signal S1 is encrypted, such a wireless power receiver 4 is capable of decrypting the electric power signal S1 and receiving the power supply. In a case in which a wireless power receiver does not know the encryption code, the wireless power receiver cannot appropriately control the switching operation of the automatic tuning assist circuit 60. Thus, such a wireless power receiver cannot receive electric power. With wireless power transmission, there is a problem of potential power theft by malicious users. However, by employing such an automatic tuning assist circuit, such a problem can be solved.

Also, in a case in which a single wireless power supply transmitter 2 supplies electric power to multiple wireless power receiveres 4, by employing such an automatic tuning assist circuit, such an arrangement is capable of controlling the amount of electric power to be supplied to each terminal.

The usage of the automatic tuning assist circuit 30 is not restricted to such wireless power transmission. Rather, the present invention is applicable to various kinds of applications which require tuning.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A wireless power supply transmitter configured to transmit an electric power signal comprising any one from among an electric field, a magnetic field, and an electromagnetic field to a wireless power receiver, the wireless power supply transmitter comprising:
   a transmission antenna comprising a transmission coil;
   an AC power supply comprising a half bridge type or an H-bridge type inverter, wherein one output of the inverter is coupled to one end of the transmission antenna, and another output of the inverter is coupled to another end of the transmission antenna, and the AC power supply is configured to apply an AC driving voltage across the transmission antenna; and
   an automatic tuning assist circuit coupled with the transmission antenna, and configured to inject a correction current into, or otherwise to draw a correction current from, the transmission antenna,
   wherein the automatic tuning assist circuit comprises:
      a first terminal and a second terminal coupled with the transmission antenna;
      an H-bridge circuit arranged between the first terminal and the second terminal; and
      a third auxiliary coil arranged between output terminals of the H-bridge circuit.

2. The wireless power supply transmitter according to claim 1, wherein the H-bridge circuit is switched with the same frequency as that of the driving voltage, or otherwise with a frequency obtained by multiplying or otherwise dividing the frequency of the driving voltage by an odd number.

3. The wireless power supply transmitter according to claim 1, further comprising a control unit configured to switch the H-bridge circuit with a predetermined phase difference with respect to the driving voltage.

4. The wireless power supply transmitter according to claim 3, wherein a plurality of switches that form the H-bridge circuit each comprise:
   a uni-directional switch; and
   a rectifier diode arranged in series with the uni-directional switch in a direction that is the reverse of the forward direction of an inversely conducting element formed in the uni-directional switch.

5. The wireless power supply transmitter according to claim 3, wherein a plurality of switches that form the H-bridge circuit are each configured as a bi-directional switch.

6. The wireless power supply transmitter according to claim 1, wherein the automatic tuning assist circuit is directly coupled with the transmission antenna.

7. The wireless power supply transmitter according to claim 1, wherein the automatic tuning assist circuit is coupled with the transmission antenna via a transformer.

8. The wireless power supply transmitter according to claim 1, wherein the first terminal is connected to one end of the transmission coil, and the second terminal is connected to the other end of the transmission coil.

9. The wireless power supply transmitter according to claim 1, wherein the transmission antenna further comprises a resonance capacitor arranged in series with the transmission coil,
   and wherein the first terminal is connected to one end of the resonance capacitor, and the second terminal is connected to the other end of the resonance capacitor.

10. The wireless power supply transmitter according to claim 1, wherein a tap is provided to the transmission coil,
    and wherein the first terminal is connected to the tap,
    and wherein the second terminal is connected to one end of the transmission coil.

11. The wireless power supply transmitter according to claim 1, wherein the transmission antenna further comprises two resonance capacitors arranged in series with the transmission coil,
    and wherein the first terminal is connected to one end of one of the resonance capacitors, and the second terminal is connected to the other end of the aforementioned one resonance capacitor.

12. The wireless power supply transmitter according to claim 1, further comprising a first coil magnetically coupled with the transmission coil,
    wherein the first terminal is connected to one end of the first coil, and the second terminal is connected to the other end of the first coil.

13. The wireless power supply transmitter according to claim 1, further comprising a transformer having a primary winding arranged in series with the transmission antenna,
    wherein the first terminal is connected to one end of a secondary winding of the transformer, and the second terminal is connected to the other end of the secondary winding of the transformer.

14. A wireless power supply system comprising:
    the wireless power supply transmitter according to claim 1, configured to transmit an electric power signal comprising any one from among an electric field, a magnetic field, and an electromagnetic field; and
    a wireless power receiver configured to receive the electric power signal from the wireless power supply transmitter.

15. A wireless power receiver configured to receive an electric power signal comprising any one from among an electric field, a magnetic field, and an electromagnetic field, transmitted from a wireless power supply transmitter, the wireless power receiver comprising:
    a reception antenna comprising a reception coil; and
    an automatic tuning assist circuit coupled with the reception antenna, and configured to inject a correction current into, or otherwise draw a correction current from, the reception antenna,
    wherein the automatic tuning assist circuit comprises:
       a first terminal and a second terminal coupled with the reception antenna;
       an H-bridge circuit arranged between the first terminal and the second terminal; and
       a third auxiliary coil arranged between output terminals of the H-bridge circuit,
    and
    wherein a load is coupled across the reception antenna and the load comprises a rectifier circuit that rectifies a voltage across the reception antenna.

16. The wireless power receiver according to claim 15, wherein the H-bridge circuit is configured to be switched with the same frequency as that of the electric power signal, or otherwise with a frequency obtained by multiplying or dividing the frequency of the electric power signal by an odd number.

17. The wireless power receiver according to claim 15, further comprising a control unit configured to perform a switching operation of the H-bridge circuit with a predetermined phase difference with respect to the electric power signal.

18. The wireless power receiver according to claim 15, wherein a plurality of switches that form the H-bridge circuit each comprise:
   a uni-directional switch; and
   a rectifier diode arranged in series with the uni-directional switch in a direction that is the reverse of the forward direction of an inversely conducting element formed in the uni-directional switch.

19. The wireless power receiver according to claim 15, wherein a plurality of switches that form the H-bridge circuit are each configured as a bi-directional switch.

20. The wireless power receiver according to claim 15, wherein the automatic tuning assist circuit is directly coupled with the reception antenna.

21. The wireless power receiver according to claim 15, wherein the automatic tuning assist circuit is coupled with the reception antenna via a transformer.

22. The wireless power receiver according to claim 15, wherein the first terminal is connected to one end of the reception coil, and the second terminal is connected to the other end of the reception coil.

23. The wireless power receiver according to claim 15, wherein the reception antenna further comprises a resonance capacitor arranged in series with the reception coil, and wherein the first terminal is connected to one end of the resonance capacitor, and the second terminal is connected to the other end of the resonance capacitor.

24. The wireless power receiver according to claim 15, wherein a tap is provided to the reception coil,
   and wherein the first terminal is connected to the tap,
   and wherein the second terminal is connected to one end of the reception coil.

25. The wireless power receiver according to claim 15, wherein the reception antenna further comprises two resonance capacitors arranged in series with the reception coil,
   and wherein the first terminal is connected to one end of one of the resonance capacitors, and the second terminal is connected to the other end of the aforementioned one resonance capacitor.

26. The wireless power receiver according to claim 15, further comprising a first coil magnetically coupled with the reception coil,
   wherein the first terminal is connected to one end of the first coil, and the second terminal is connected to the other end of the first coil.

27. The wireless power receiver according to claim 15, further comprising a transformer having a primary winding arranged in series with the reception antenna,
   wherein the first terminal is connected to one end of a secondary winding of the transformer, and the second terminal is connected to the other end of the secondary winding of the transformer.

28. A wireless power supply system comprising:
   a wireless power supply transmitter configured to transmit an electric power signal comprising any one from among an electric field, a magnetic field, and an electromagnetic field; and
   the wireless power receiver according to claim 15, configured to receive the electric power signal.

* * * * *